(12) United States Patent
Choi et al.

(10) Patent No.: US 12,238,978 B2
(45) Date of Patent: Feb. 25, 2025

(54) DISPLAY DEVICE INCLUDING SHOCK ABSORBING LAYER

(71) Applicant: SAMSUNG DISPLAY CO., LTD., Yongin-si (KR)

(72) Inventors: Wonwoo Choi, Yongin-si (KR); Inbae Kim, Yongin-si (KR); Donghun Nam, Yongin-si (KR); Changwoo Shim, Yongin-si (KR); Sumin An, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 330 days.

(21) Appl. No.: 17/521,476

(22) Filed: Nov. 8, 2021

(65) Prior Publication Data

US 2022/0328586 A1    Oct. 13, 2022

(30) Foreign Application Priority Data

Apr. 12, 2021    (KR) .................. 10-2021-0047338

(51) Int. Cl.
*H10K 59/12*    (2023.01)
*H10K 50/84*    (2023.01)
(Continued)

(52) U.S. Cl.
CPC ......... *H10K 59/124* (2023.02); *H10K 50/844* (2023.02); *H10K 59/40* (2023.02); *G06F 3/0412* (2013.01); *H10K 50/868* (2023.02); *H10K 59/1213* (2023.02); *H10K 59/1216* (2023.02); *H10K 59/122* (2023.02); *H10K 59/123* (2023.02); *H10K 59/126* (2023.02);
(Continued)

(58) Field of Classification Search
CPC .... H10K 50/844; H10K 50/80; H10K 50/868; H10K 59/124; H10K 59/40; H10K 59/12; H10K 59/122; H10K 59/1216; H10K 59/352; H10K 59/1213; H10K 59/38; H10K 59/865; H10K 59/126; H10K 59/131; H10K 59/123; H10K 2102/351; G06F 3/0412
See application file for complete search history.

(56) References Cited

U.S. PATENT DOCUMENTS 9,865,665 B2    1/2018    Eguchi et al.
10,003,047 B2    6/2018    Yamazaki et al.
(Continued)

FOREIGN PATENT DOCUMENTS

JP    2020-160452 A    10/2020
KR    10-2015-0081563 A    7/2015
(Continued)

*Primary Examiner* — Ida M Soward
(74) *Attorney, Agent, or Firm* — Lewis Roca Rothgerber Christie LLP

(57) ABSTRACT

Provided is a display device including a substrate, a semiconductor layer on the substrate, an interlayer insulating layer on the semiconductor layer, a source electrode or a drain electrode on the interlayer insulating layer, and connected to the semiconductor layer, an organic light-emitting diode connected to the source electrode or the drain electrode, and a thin film encapsulation layer on the organic light-emitting diode, wherein, a neutral plane corresponding to an impact applied to the thin film encapsulation layer is inside or below the interlayer insulating layer.

20 Claims, 11 Drawing Sheets

(51) Int. Cl.
  *H10K 50/844*   (2023.01)
  *H10K 59/124*   (2023.01)
  *H10K 59/40*    (2023.01)
  *G06F 3/041*        (2006.01)
  *H10K 50/80*        (2023.01)
  *H10K 59/121*       (2023.01)
  *H10K 59/122*       (2023.01)
  *H10K 59/123*       (2023.01)
  *H10K 59/126*       (2023.01)
  *H10K 59/131*       (2023.01)
  *H10K 59/35*        (2023.01)
  *H10K 59/38*        (2023.01)
  *H10K 102/00*       (2023.01)

(52) U.S. Cl.
  CPC ......... *H10K 59/131* (2023.02); *H10K 59/352* (2023.02); *H10K 59/38* (2023.02); *H10K 2102/351* (2023.02)

(56) References Cited

U.S. PATENT DOCUMENTS

| | | |
|---|---|---|
| 10,312,461 B2 | 6/2019 | Qin |
| 11,016,622 B2 | 5/2021 | Yang |
| 2015/0195915 A1 | 7/2015 | Namkung |
| 2016/0204347 A1* | 7/2016 | Kim ................. H10K 71/621 |
| | | 438/26 |
| 2017/0047545 A1* | 2/2017 | Kwak ................. H10K 59/12 |
| 2017/0117487 A1* | 4/2017 | Kawakami ......... H10K 85/6572 |
| 2017/0186971 A1* | 6/2017 | Kanamoto .......... H10K 85/6572 |
| 2018/0175310 A1* | 6/2018 | Lee .................. B32B 27/308 |
| 2018/0350893 A1* | 12/2018 | Odaka ................ H01L 24/83 |
| 2019/0165060 A1* | 5/2019 | Choi .................. H10K 50/8428 |
| 2019/0207133 A1* | 7/2019 | Park .................. G09G 3/3291 |
| 2019/0361550 A1* | 11/2019 | Sonoda ............... G06F 3/047 |
| 2020/0075895 A1* | 3/2020 | Oh ..................... H10K 59/40 |
| 2020/0110495 A1* | 4/2020 | Han ................... G06F 3/0446 |
| 2020/0252707 A1* | 8/2020 | Won .................. H04R 9/025 |
| 2020/0411598 A1* | 12/2020 | Gwon ................ G06F 3/0412 |
| 2021/0202868 A1* | 7/2021 | Paek .................. H10K 50/844 |

FOREIGN PATENT DOCUMENTS

| | | |
|---|---|---|
| KR | 10-2018-0045888 A | 5/2018 |
| KR | 10-2020-0115446 A | 10/2020 |
| KR | 10-2020-0115807 A | 10/2020 |
| KR | 10-2020-0144626 A | 12/2020 |

\* cited by examiner

DISPLAY DEVICE INCLUDING SHOCK ABSORBING LAYER

CROSS-REFERENCE TO RELATED APPLICATION

This application claims priority to, and the benefit of, Korean Patent Application No. 10-2021-0047338, filed on Apr. 12, 2021, in the Korean Intellectual Property Office, the disclosure of which is incorporated by reference herein in its entirety.

BACKGROUND

1. Field

One or more embodiments relate to display devices.

2. Description of the Related Art

Mobility-based electronic devices are widely used. As mobile electronic devices, in addition to small electronic devices such as mobile phones, tablet PCs have been widely used in recent years.

Such mobile electronic devices include display devices to support various functions and provide visual information such as images or video to a user. Recently, as other components for driving display devices are miniaturized, the proportion of display devices in electronic devices is gradually increasing, and a structure that can be bent to have a certain angle with respect to a flat state is being developed.

In this case, when an object falls on an upper surface of a display device for forming an image, some layers of the display device may be broken or damaged. In other words, when an object falls and collides with the upper surface of the display device, some inner layers are broken or damaged such that some pixels of the display device do not work and dark dots may form.

For example, the above problem occurs in display devices that are freely deformable.

SUMMARY

One or more embodiments relate to display devices capable of implementing clear images even after external impacts are applied thereto.

Additional aspects will be set forth in part in the description that follows and, in part, will be apparent from the description, or may be learned by practice of the presented embodiments of the disclosure.

According to some embodiments, a display device includes a substrate, a semiconductor layer on the substrate, an interlayer insulating layer on the semiconductor layer, a source electrode or a drain electrode on the interlayer insulating layer, and connected to the semiconductor layer, an organic light-emitting diode connected to the source electrode or the drain electrode, and a thin film encapsulation layer on the organic light-emitting diode, wherein, a neutral plane corresponding to an impact applied to the thin film encapsulation layer is inside or below the interlayer insulating layer.

A distance from a bottom of the substrate to a bottom of the interlayer insulating layer may be greater than a distance from an upper surface of the interlayer insulating layer to an upper surface of the thin film encapsulation layer.

The thin film encapsulation layer may include an organic encapsulation layer, wherein a thickness of the organic encapsulation layer is between about 0.16 times and about 0.26 times a distance from a bottom of the substrate to an upper surface of the thin film encapsulation layer.

The interlayer insulating layer may include a first interlayer insulating layer, and a second interlayer insulating layer on the first interlayer insulating layer.

A thickness of the first interlayer insulating layer may be greater than a thickness of the second interlayer insulating layer.

The second interlayer insulating layer may have a structure in which an inorganic material and an organic material are sequentially stacked.

The first interlayer insulating layer may include silicon oxide.

The display device may further include a shock absorbing layer on the interlayer insulating layer.

The shock absorbing layer may include an organic material.

The display device may further include an input detection member on the thin film encapsulation layer.

According to some embodiments, a display device includes a substrate, a semiconductor layer on the substrate, an interlayer insulating layer on the semiconductor layer, a source electrode or a drain electrode on the interlayer insulating layer, and connected to the semiconductor layer, an organic light-emitting diode connected to the source electrode or the drain electrode, and a thin film encapsulation layer on the organic light-emitting diode, wherein a thickness of the substrate is between about 0.5 times and about 0.76 times a distance from a lower surface of the substrate to an upper surface of the thin film encapsulation layer.

The thin film encapsulation layer may include an organic encapsulation layer, wherein a thickness of the organic encapsulation layer is between about 0.16 times and about 0.26 times a distance from a bottom of the substrate to an upper surface of the thin film encapsulation layer.

The interlayer insulating layer may include a first interlayer insulating layer, and a second interlayer insulating layer on the first interlayer insulating layer.

A thickness of the first interlayer insulating layer may be greater than a thickness of the second interlayer insulating layer.

The second interlayer insulating layer may have a structure in which an inorganic material and an organic material are sequentially stacked.

The first interlayer insulating layer may include silicon oxide.

The display device may further include a shock absorbing layer on the interlayer insulating layer.

The shock absorbing layer may include an organic material.

The display device may further include an input detection member on the thin film encapsulation layer.

According to some embodiments, a display device includes a substrate, a semiconductor layer on the substrate, an interlayer insulating layer on the semiconductor layer, a source electrode or a drain electrode on the interlayer insulating layer, and connected to the semiconductor layer, an organic light-emitting diode connected to the source electrode or the drain electrode, and a thin film encapsulation layer on the organic light-emitting diode, wherein a compressive force corresponding to an impact is applied to the thin film encapsulation layer is generated in the interlayer insulating layer.

The interlayer insulating layer may include a first interlayer insulating layer, and a second interlayer insulating layer on the first interlayer insulating layer.

The second interlayer insulating layer may have a structure in which an inorganic material and an organic material are sequentially stacked.

Other aspects than those described above will become apparent from the following drawings, claims, and detailed description of the disclosure.

BRIEF DESCRIPTION OF THE DRAWINGS

The above and other aspects of embodiments of the disclosure will be more apparent from the following description taken in conjunction with the accompanying drawings, in which.

DETAILED DESCRIPTION

Figure 1:
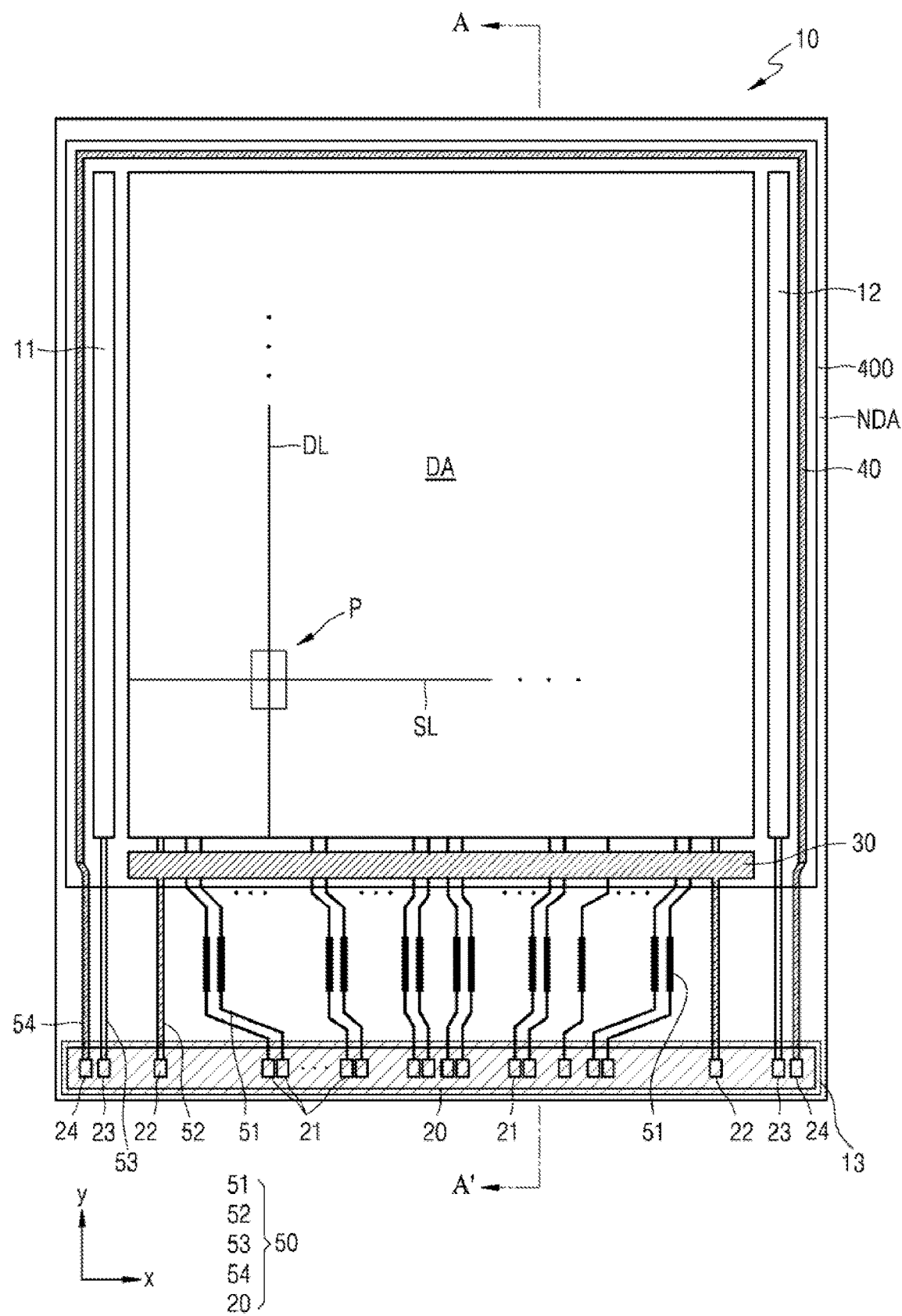
FIG. 1 is a schematic plan view of a display device according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

In some embodiments below, a thickness is measured in the z-axis direction of the drawing, and it may mean a distance from one side of one layer to one side of another layer at any point. In this state, in some embodiments below, the thickness of each layer may also be interpreted as the thickness of an arithmetic mean on the entire surface of each layer in addition to the value measured at any point.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
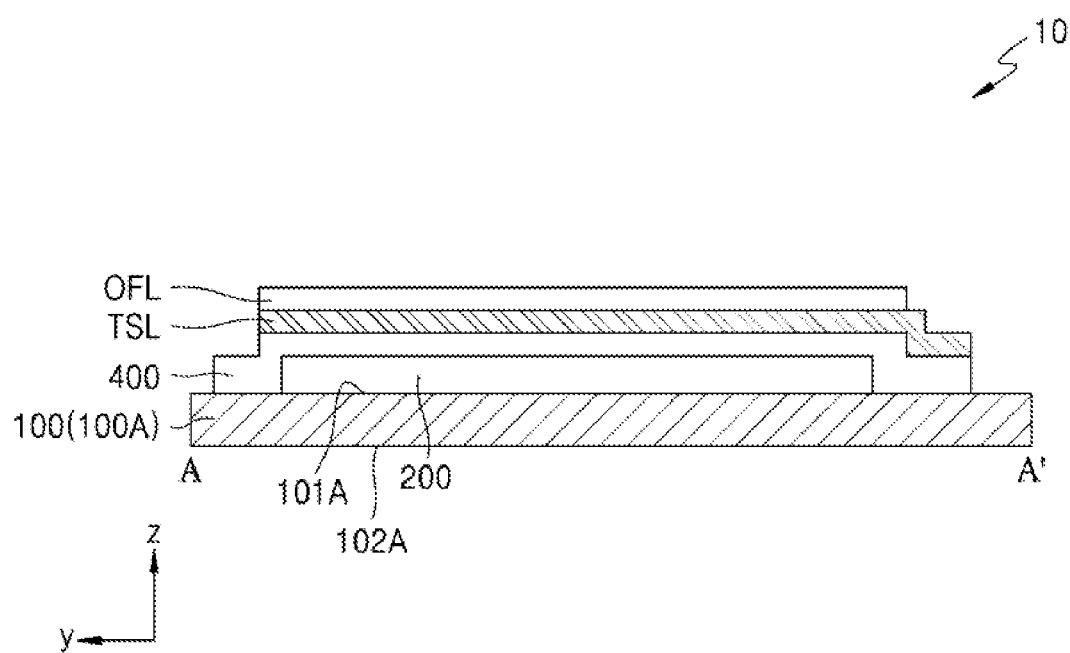
FIG. 2 is a cross-sectional view of a part of the display of FIG. 1.
Figure 3:
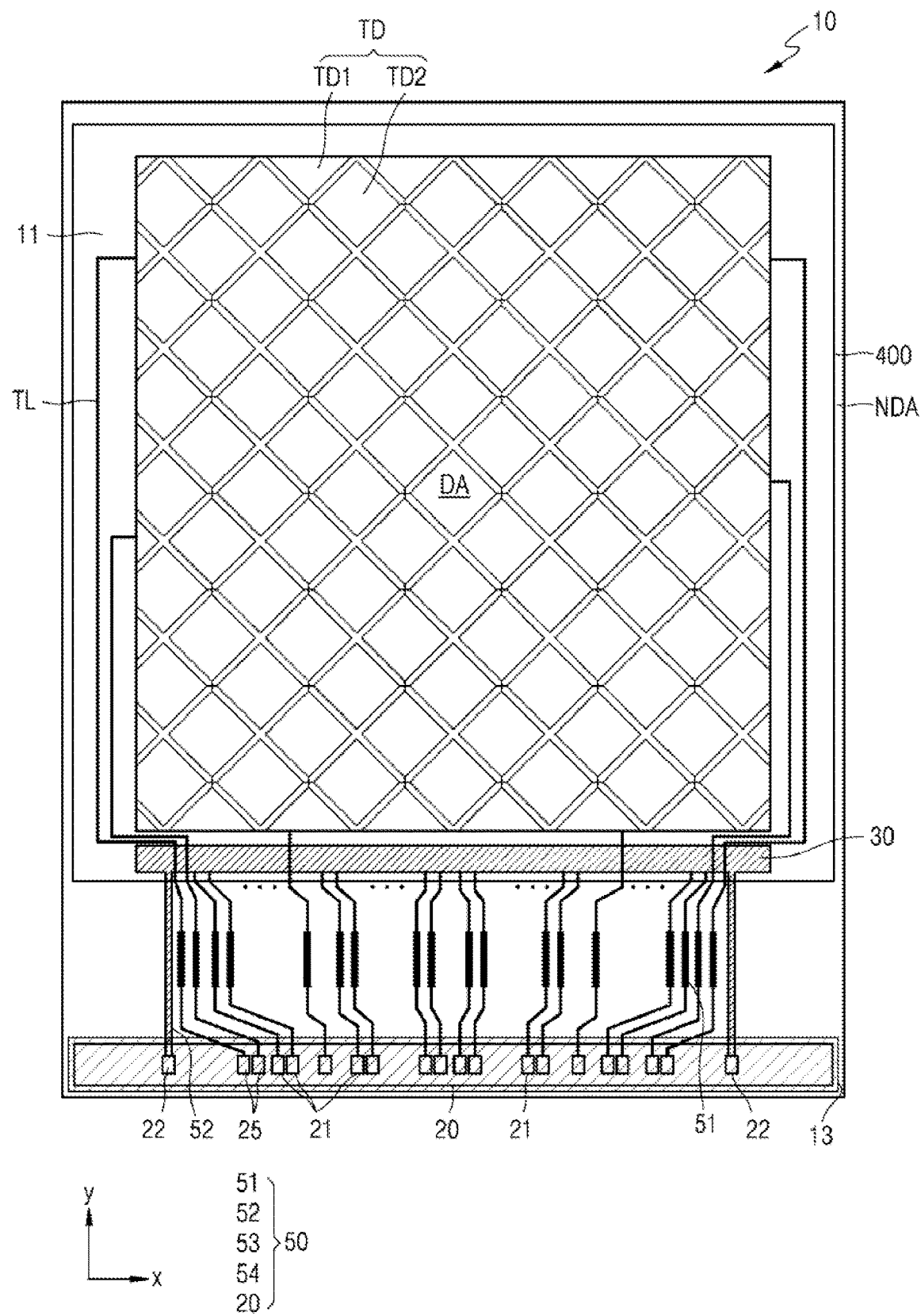
FIG. 3 is a schematic plan view of the display device of FIG. 1.

FIG. 1 is a schematic plan view of a display device 10 according to some embodiments. FIG. 2 is a cross-sectional view of a part of the display device 10, taken along the line A-A' of FIG. 1. FIG. 3 is a schematic plan view of the display device 10 of FIG. 1.

Referring to FIGS. 1 to 3, the display device 10 may include a display area DA and a non-display area NDA. The display area DA is where pixels P are arranged. The display area DA may provide an image by using light emitted from the pixels P. The pixels P may be connected to respective signal lines, such as a scan line SL extending in an x-axis direction and a data line DL extending in a y-axis direction. In some embodiments, the pixel P may be connected to power lines configured to deliver DC signals, such as a driving power line, a common power line, and the like. The display area DA may be covered by a thin film encapsulation layer 400 overlapping a substrate 100.

The pixel P may include a pixel circuit electrically connected to the above-described signal lines and power line, and a display element, for example, an organic light-emitting diode (OLED), in the pixel circuit. The pixel P may emit, for example, red, green, blue, or white light, through the OLED.

The non-display area NDA may include a first scan driver 11, a second scan driver 12, a terminal part 20, a driving voltage supply line 30, a common voltage supply line 40, and a wiring layer 50. The non-display area NDA is where no pixel is arranged.

The first scan driver 11 and the second scan driver 12 may be arranged in the non-display area NDA. The first scan driver 11 and the second scan driver 12 may be apart from each other with the display area DA therebetween. The first scan driver 11 and/or the second scan driver 12 may generate and deliver scan signals to the pixels P through the scan lines SL. Although FIG. 1 illustrates a case in which two scan drivers are arranged, the disclosure is not limited thereto. In other embodiments, one scan driver may be arranged at one side of the display area DA.

The terminal part 20 may be arranged at one end portion of the non-display area NDA, and may include terminals 21, 22, 23, and 24. The terminal part 20 may be exposed due to not being covered by an insulating layer, and may be connected to a driver IC 13. The driver IC 13 may include a data driver.

The driving voltage supply line 30 may provide a driving voltage to the pixels P. The driving voltage supply line 30 may be arranged in the non-display area NDA to be adjacent to one side of the display area DA.

The common voltage supply line 40 may provide a common voltage to the pixels P. The common voltage may be applied to a cathode electrode of the OLED, and the common voltage supply line 40 may be arranged in the non-display area NDA to partially surround the display area DA.

A first wiring 51, a second wiring 52, a third wiring 53, and a fourth wiring 54 may be arranged between one end portion of the display area DA and the terminal part 20, and may extend in a y-axis direction. The first wiring 51 electrically connects the signal lines of the display area DA to the terminal part 20, and the second wiring 52 electrically connects the driving voltage supply line 30 to the terminal part 20. The third wiring 53 electrically connects each of the first scan driver 11 and the second scan driver 12 to the terminal part 20, and the fourth wiring 54 electrically connects the common voltage supply line 40 to the terminal part 20.

Although FIG. 1 illustrates that the reference numerals of the terminals 21, 22, 23, and 24 of the terminal part 20 are different from those of the first wiring 51, the second wiring 52, the third wiring 53, and the fourth wiring 54, the terminals 21, 22, 23, and 24 may be respectively understood as parts of the first wiring 51, the second wiring 52, the third wiring 53, and the fourth wiring 54. In other words, an end portion of the first wiring 51 may correspond to the terminal 21, an end portion of the second wiring 52 may correspond to the terminal 22, an end portion of the third wiring 53 may correspond to the terminal 23, and an end portion of the fourth wiring 54 may correspond to the terminal 24.

A display layer 200 is arranged on the substrate 100. The display layer 200 may include a plurality of pixels. As each pixel may include a display element and a pixel circuit for an operation of the display element, the display layer 200 may include a plurality of display elements and pixel circuits connected to the respective display elements.

The display layer 200 may be shielded by the thin film encapsulation layer 400. The thin film encapsulation layer 400 may include at least one organic encapsulation layer and at least one inorganic encapsulation layer. At least one organic encapsulation layer and at least one inorganic encapsulation layer may be alternately stacked. An input detection member TSL and an optical functional member OFL may be arranged on the thin film encapsulation layer 400.

The input detection member TSL may include a touch electrode TD of various patterns for a touch screen function. The touch electrode TD may include first touch electrodes TD1 connected to each other in a first direction (y-axis direction), and second touch electrodes TD2 connected to each other in a second direction (x-axis direction) crossing the first direction.

The touch electrode TD may include a transparent electrode material to transmit light from a light-emitting area of pixels arranged below the input detection member TSL. Alternatively, the touch electrode TD may be provided in a mesh shape to transmit light from the light-emitting area of pixels. In this case, the touch electrode TD is not limited to a transparent electrode material. For example, the touch electrode TD may be a single film or a multilayer film including a conductive material including aluminum (Al), copper (Cu), and/or titanium (Ti), and the like.

The touch electrode TD may be connected to a touch wiring TL configured to deliver a sensed signal to the touch electrode TD, and the touch wiring TL may extend from an upper surface of the thin film encapsulation layer 400 toward the non-display area NDA at one surface of the thin film encapsulation layer 400.

The touch wiring TL may be connected to the touch electrode TD of the input detection member TSL of the display area DA, and may extend from an upper portion of the thin film encapsulation layer 400. The touch wiring TL may be connected to a touch terminal 25 of the terminal part 20 to exchange electrical signals with the input detection member TSL.

The optical functional member OFL may reduce reflectivity of light (external light) incident on the display device 10 from the outside, and/or improve color purity of light emitted from the display device 10.

In some embodiments, the optical functional member OFL may include a retarder and a polarizer. The retarder may be of a film type or a liquid crystal coating type, and may include a λ/2 retarder and/or a λ/4 retarder. The polarizer may also be of a film type or a liquid crystal coating type. The film type may include a stretchable synthetic resin film, and the liquid crystal coating type may include liquid crystals arranged in a certain array.

In other embodiments, the optical functional member OFL may include a black matrix and color filters. The color filters may be arranged considering the color of light emitted from each of the pixels of the display device 10. Each of the color filters may include red, green, or blue pigment or dye. Alternatively, each of the color filters may further include quantum dots in addition to the above-described pigment or dye. Alternatively, some of the color filters may not include the above-described pigment or dye, and may include scattering particles such as titanium oxide.

In other embodiments, the optical functional member OFL may include a destructive interference structure. The destructive interference structure may include two reflective layers. Reflected light reflected from one of the two reflective layers may undergo destructive interference with reflected light reflected from the other of the two reflective layers, and thus reflectivity of external light may be reduced.

Figure 4:
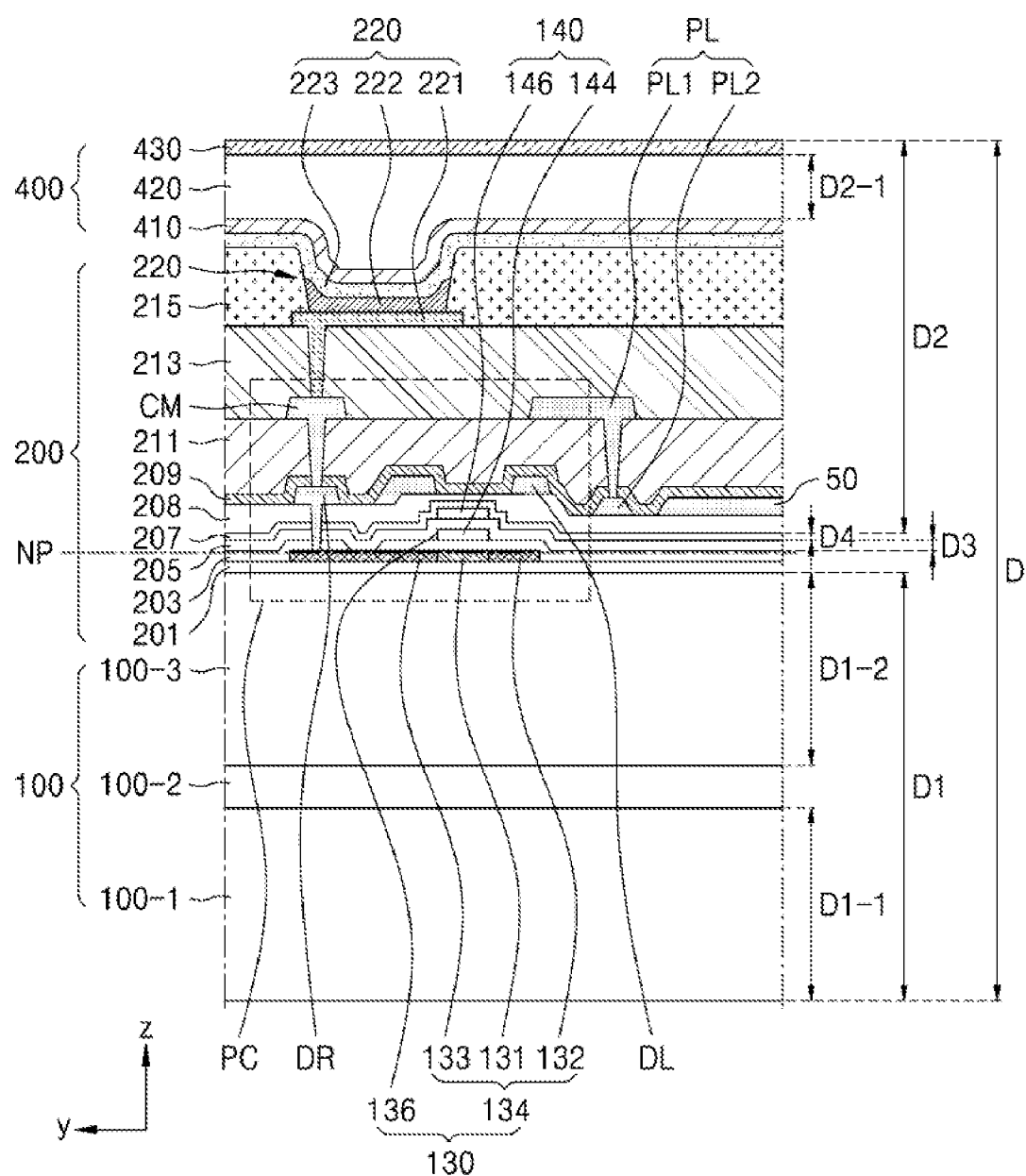
FIG. 4 is a cross-sectional view of a part of the display device of FIG. 1.

FIG. 4 is a cross-sectional view of a part of the display device 10 of FIG. 1.

Referring to FIG. 4, the display layer 200 is arranged on the substrate 100, and the display layer 200 may include a pixel circuit PC and an organic light-emitting diode 220 connected to the pixel circuit PC.

The substrate 100 may include an insulating material such as glass, quartz, polymer resin, and the like. The substrate 100 may include a flexible substrate capable of bending, folding, rolling, and the like. For example, the substrate 100 may include polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. In some embodiments, the substrate 100 may have a multilayer structure including a layer including the above-described polymer resin and an inorganic layer. For example, the substrate 100 may include two layers including the above-described polymer resin and an inorganic barrier layer interposed therebetween.

For example, the substrate 100 may include a first substrate 100-1, a second substrate 100-3, and an inorganic barrier layer 100-2. In this state, each of the first substrate 100-1 and the second substrate 100-3 may include at least one of the above-described materials. In this case, the first substrate 100-1 and the second substrate 100-3 may include the same material or different materials.

A first-1 thickness D1-1 of the first substrate 100-1 and a first-2 thickness D1-2 of the second substrate 100-3 may be the same or different from each other. For example, one of the first-1 thickness D1-1 and the first-2 thickness D1-2 may be greater than, or equal to, the other of the first-1 thickness D1-1 and the first-2 thickness D1-2.

The inorganic barrier layer 100-2 may be arranged between the first substrate 100-1 and the second substrate 100-3. The inorganic barrier layer 100-2 may reduce or prevent infiltration of moisture into the organic light-emitting diode 220 through the first substrate 100-1 and the second substrate 100-3.

Generally, when an object falls on the display device 10 and collides with an upper surface of the display device 10, various layers of the display device 10 may be deformed. For example, when an object collides with the upper surface of the display device 10, layers of the display device 10 arranged in a thickness direction may be deformed to become concave, and the display device 10 may be bent therefrom. In this state, a certain position of the display device 10 may become a neutral plane (NP), and with respect to the neutral plane NP, a compressive force may be generated above the neutral plane NP of the display device 10, and a tensile force may be generated below the neutral plane NP of the display device 10. In this state, when a layer including an inorganic material is located in an area where a tensile force is generated, the layer including an inorganic material may be damaged. For example, when at least one of a first interlayer insulating layer 205 and a second interlayer insulating layer 207 is damaged, a portion of the display device 10 might not work so that dark spots may form.

To solve the above problem, a first thickness D1 of the substrate 100 may be between about 0.5 times and about 0.76 times a thickness D from the bottom of the substrate 100 to the upper surface of the thin film encapsulation layer 400.

When the first thickness D1 is less than about 0.5 times the thickness D from the bottom of the substrate 100 to the upper surface of the thin film encapsulation layer 400, and when an object collides with the display device 10, as the neutral plane NP is located above the first and second interlayer insulating layers 205 and 207, the interlayer insulating layers may be damaged.

In contrast, when the first thickness D1 exceeds about 0.76 times the thickness D from the bottom of the substrate 100 to the upper surface of the thin film encapsulation layer 400, the substrate 100 itself may be prevented from being suitably uneven or curved, and thus bending or deformation of the display device 10 may be excessively reduced.

Furthermore, the first thickness D1 may be greater than a second thickness D2. In this case, as the first thickness D1 is greater than the second thickness D2, the neutral plane NP may be located on a lower surface of at least one of the first interlayer insulating layer 205 and the second interlayer insulating layer 207.

A buffer layer 201 may be arranged on the substrate 100. The buffer layer 201 may block foreign materials or moisture that infiltrates through the substrate 100. The buffer layer 201 may include an inorganic insulating material, for example, silicon oxide, silicon nitride, or/and silicon oxynitride, and may include a single layer or a multilayer of the above-described material.

The pixel circuit PC may include a transistor 130 and a storage capacitor 140. The transistor 130 may include a semiconductor layer 134 and a gate electrode 136. The semiconductor layer 134 may include, for example, polysilicon. The semiconductor layer 134 may include a channel region 131 overlapping the gate electrode 136, and may include a source region 132 and a drain region 133 arranged at both sides of the channel region 131 and including impurities having a higher concentration than the channel region 131. The impurities may include N-type impurities or P-type impurities. The source region 132 and the drain region 133, and metals connected to the source region 132 and the drain region 133, may be respectively understood as a source electrode and a drain electrode DR of the transistor 130. In this state, the source electrode and the drain electrode DR may be arranged at the same layer. For example, the source electrode and the drain electrode DR may be arranged on a shock absorbing layer 208 that is described below.

In the following description, for convenience of explanation, a case in which the drain electrode DR is connected to the drain region 133 is mainly described. In other embodiments, the semiconductor layer 134 may include amorphous silicon, an oxide semiconductor, an organic semiconductor, and the like.

The gate electrode 136 may include a low-resistance metal material. The gate electrode 136 may include a conductive material including molybdenum (Mo), Al, Cu, Ti, and the like, and may be formed in a multilayer or a single layer including the above material. In some embodiments, the gate electrode 136 may be a metal layer including Mo.

A gate insulating layer 203 may be arranged between a semiconductor layer 134 and the gate electrode 136. The gate insulating layer 203 may include an inorganic insulating material, for example, silicon oxide, silicon nitride, or/and silicon oxynitride, and include a single layer or a multilayer of the above-described material.

The storage capacitor 140 may include a first electrode 144 and a second electrode 146, overlapping each other. The first interlayer insulating layer 205 may be arranged between the first electrode 144 and the second electrode 146. The first interlayer insulating layer 205 may include an inorganic insulating material, for example, silicon oxide, silicon nitride, or/and silicon oxynitride, and include a single layer or a multilayer of the above-described material. The second electrode 146 may include a conductive material including Mo, Al, Cu, Ti, and the like, and include a multilayer or a single layer including the above materials. In some embodiments, the second electrode 146 may be a metal layer including Mo.

Although FIG. 4 illustrates a case in which the storage capacitor 140 overlaps the transistor 130, and in which the first electrode 144 is the gate electrode 136 of the transistor 130, the disclosure is not limited thereto. In other embodiments, the storage capacitor 140 may not overlap the transistor 130. The first electrode 144 may be a separate constituent element independent of the gate electrode 136 of the transistor 130.

The storage capacitor 140 may be covered by the second interlayer insulating layer 207. The second interlayer insulating layer 207 may include an inorganic insulating material, for example, silicon oxide, silicon nitride, or/and silicon oxynitride, and include a single layer or a multilayer of the above-described material.

In the above case, the first interlayer insulating layer 205 and the second interlayer insulating layer 207 may include materials that are different from each other. For example, the first interlayer insulating layer 205 may include at least one of silicon oxide and silicon oxynitride, and the second interlayer insulating layer 207 may include silicon nitride.

A third thickness D3 of the first interlayer insulating layer 205 may be different from a fourth thickness D4 of the second interlayer insulating layer 207. In this case, the third thickness D3 may be greater than the fourth thickness D4.

In the above case, when an object collides with the display device 10, and the neutral plane NP is located between the first interlayer insulating layer 205 and the second interlayer insulating layer 207, an area where a tensile force is generated and an area where a compressive force is generated may be respectively formed at the first interlayer insulating layer 205 and the second interlayer insulating layer 207. In this case, a tensile force may be generated in an area below the neutral plane NP, and a compressive force may be generated in an area above the neutral plane NP. In this case, among the first interlayer insulating layer 205 and the second interlayer insulating layer 207, an area where a tensile force is generated may be arranged in the first interlayer insulating layer 205, or an area where a tensile force is generated may have a reduced or minimum thickness.

When the first interlayer insulating layer 205 includes at least one of silicon oxide and silicon oxynitride as described above, and the neutral plane NP is located on the first interlayer insulating layer 205 or inside the second interlayer insulating layer 207, even when the neutral plane NP is mainly located inside the first interlayer insulating layer 205 or inside the second interlayer insulating layer 207, a portion that receives much of a corresponding tensile force when an object collides with the display device 10 may be mainly the first interlayer insulating layer 205.

In the above case, as the at least one of silicon oxide and silicon oxynitride endures the tensile force better than the silicon nitride does, when the tensile force is generated, the first interlayer insulating layer 205 might not be damaged by the tensile force to the extent that the second interlayer insulating layer 207 would be.

Furthermore, when the third thickness D3 is greater than the fourth thickness D4, the neutral plane NP may be located below the second interlayer insulating layer 207 or inside the second interlayer insulating layer 207. In this case, as the thickness of an area where the second interlayer insulating layer 207 is tensioned decreases, when an object collides with the display device 10, a likelihood of damage to the second interlayer insulating layer 207 may be reduced or prevented.

The shock absorbing layer 208 may be arranged on the second interlayer insulating layer 207. The shock absorbing layer 208 may include an organic material. For example, the shock absorbing layer 208 may include general purpose polymer such as imide-based polymer, polymethylmethacrylate (PMMA), polystyrene (PS), polymer derivatives with a phenol-based group, acrylic polymer, arylether-based polymer, amide-based polymer, fluorine-based polymer, p-xylene-based polymer, vinyl alcohol-based polymer, a blend thereof, and the like.

The shock absorbing layer 208 may reduce or prevent transfer force from an impact (e.g., due to an object falling from above the display device 10) to the first interlayer insulating layer 205 and the second interlayer insulating layer 207. In other words, when an object falls from above the display device 10 to collide with the display device 10, a vibration or force may be transferred in a thickness direction of the display device 10. Due to the above force, at least one of the first interlayer insulating layer 205 and the second interlayer insulating layer 207 may be possibly damaged. However, as the shock absorbing layer 208 is arranged on the second interlayer insulating layer 207, transfer of the impact to at least one of the first interlayer insulating layer 205 and the second interlayer insulating layer 207 may be reduced or prevented.

The data line DL may be arranged on the second interlayer insulating layer 207 or the shock absorbing layer 208, and may be covered by a first organic insulating layer 211. In the following description, for convenience of explanation, a case in which the data line DL is arranged on the shock absorbing layer 208 is mainly described.

The data line DL may include a conductive material including Mo, Al, Cu, Ti, and the like, and may include a multilayer or a single layer including the above materials. In some embodiments, the data line DL may include in a multilayer (Ti/Al/Ti) in which a Ti layer, an Al layer, and a Ti layer are sequentially stacked. The first organic insulating layer 211 may include an organic insulating material. For example, the first organic insulating layer 211 may include polyimide.

A third interlayer insulating layer 209 may be arranged below the first organic insulating layer 211 as a passivation layer. In this state, the first organic insulating layer 211 may include a material that is the same as, or similar to, the above-described shock absorbing layer 208. The third interlayer insulating layer 209 may include an inorganic insulating material, for example, silicon oxide, silicon nitride, or/and silicon oxynitride, and include a single layer or a multilayer of the above-described material. In other embodiments, the third interlayer insulating layer 209 may be omitted.

A contact metal layer CM that electrically connects the transistor 130 to a pixel electrode 221 of the organic light-emitting diode 220 may be arranged on the first organic insulating layer 211. The contact metal layer CM may include a conductive material including Mo, Al, Cu, Ti, and the like, and include a multilayer or a single layer including the above materials. In some embodiments, the contact metal layer CM may include a multilayer (Ti/Al/Ti) in which a Ti layer, an Al layer, and a Ti layer are sequentially stacked. In some embodiments, the contact metal layer CM may be omitted.

The organic light-emitting diode 220 may be arranged on a second organic insulating layer 213. For example, the pixel electrode 221 may be located on the second organic insulating layer 213. In this state, the second organic insulating layer 213 may include a material that is the same as, or similar to, the first organic insulating layer 211. The pixel electrode 221 may include reflective film including silver (Ag), magnesium (Mg), Al, platinum (Pt), palladium (Pd), gold (Au), nickel (Ni), neodymium (Nd), iridium (Ir), chromium (Cr), and the like. The pixel electrode 221 may further include a film including indium tin oxide (ITO), indium zinc oxide (IZO), zinc oxide (ZnO), or $In_2O_3$ above and/or below the above-described reflective film.

A pixel defining layer 215 is located on the pixel electrode 221, and may have an opening for exposing a central portion of the pixel electrode 221. The pixel defining layer 215 may increase a distance between an end portion of the pixel electrode 221 and a counter electrode (e.g., a common electrode) 223, thereby reducing or preventing the likelihood of generation of arc and the like therebetween. The pixel defining layer 215 may include, for example, an organic material such as polyimide or Hexamethyldisiloxane (HMDSO). Alternatively, the pixel defining layer 215 may include an inorganic material.

An intermediate layer 222 may include an emission layer. The intermediate layer 222 may further include a first functional layer arranged below the emission layer and/or a second functional layer arranged above the emission layer. The intermediate layer 222 may include a low molecular weight or polymer material. The first functional layer may include a hole injection layer (HIL) and/or a hole transport layer (HTL). The second functional layer may include an electron transport layer (ETL) and an electron injection layer (EIL). At least any one of layers forming the intermediate layer 222 may be formed in a single body in the display area DA. For example, while the emission layer of the intermediate layer 222 is located to overlap each pixel electrode, the first functional layer and/or the second functional layer may be a common layer formed in a single body to correspond to a plurality of pixels.

A counter electrode 223 is arranged on the intermediate layer 222. The counter electrode 223 may be formed in a single body to cover a plurality of pixels. The counter electrode 223 may be a light-transmitting conductive film including Ag, Mg, Al, Pt, Pd, Au, Ni, Nd, Ir, Cr, lithium (Li), calcium (Ca), or an alloy thereof, and the like. A capping layer including LiF, an inorganic insulating material, or an organic insulating material may be further arranged on the counter electrode 223.

The wiring layer 50, as described above, may include wirings for applying a signal or/and power to the display layer 200. The wiring layer 50, for example, may be located at the same layer as the data line DL (e.g., on the shock absorbing layer 208), as illustrated in FIG. 4, and may include the same material as the data line DL.

The wiring layer 50 may extend in the display area DA toward the non-display area NDA. The wiring layer 50 may be covered by the third interlayer insulating layer 209.

A voltage wiring PL may include the driving voltage supply line 30 or the common voltage supply line 40.

The organic light-emitting diode 220 may be covered by the thin film encapsulation layer 400. In some embodiments, the thin film encapsulation layer 400 may include a first inorganic encapsulation layer 410, an organic encapsulation layer 420, and a second inorganic encapsulation layer 430.

The first inorganic encapsulation layer 410 and the second inorganic encapsulation layer 430 may include one or more inorganic insulating materials, such as aluminum oxide, titanium oxide, tantalum oxide, hafnium oxide, zinc oxide, silicon oxide, silicon nitride, or silicon oxynitride, and may be formed by a chemical vapor deposition (CVD) method and the like.

The organic encapsulation layer 420 may include a polymer-based material. The polymer-based material may include silicon-based resin, acrylic resin, epoxy-based resin, polyimide, polyethylene, and the like.

A second-1 thickness D2-1 of the organic encapsulation layer 420 may be between about 0.16 times and about 0.26 times the thickness D from the bottom of the substrate 100 to the upper surface of the thin film encapsulation layer 400.

When the second-1 thickness D2-1 of the organic encapsulation layer 420 is less than about 0.16 times the thickness D from the bottom to the upper surface of the thin film encapsulation layer 400, the upper surface of the organic encapsulation layer 420 might not be planarized, or as the second-1 thickness D2-1 of the organic encapsulation layer 420 is too thin, encapsulation performance may be deteriorated.

Furthermore, when the second-1 thickness D2-1 of the organic encapsulation layer 420 exceeds about 0.26 times the thickness D from the bottom to the upper surface of the thin film encapsulation layer 400, the neutral plane NP is located above the second interlayer insulating layer 207, and when an object falls on the upper surface of the display device 10, at least one of the first interlayer insulating layer 205 and the second interlayer insulating layer 207 may be damaged.

In the display device 10 as above, the first thickness D1 that is the thickness of the substrate 100 and the second thickness D2 from the upper surface of the second interlayer insulating layer 207 to the upper surface of the thin film encapsulation layer 400 may be different from each other. For example, the first thickness D1 may be greater than the second thickness D2. When the second thickness D2 is greater than the first thickness D1, the neutral plane NP may be located above the second interlayer insulating layer 207, and when an impact is applied to the thin film encapsulation layer 400, at least one of the first interlayer insulating layer 205 and the second interlayer insulating layer 207 may be damaged.

In contrast, as described above, when the second thickness D2 is greater than the first thickness D1, the neutral plane NP of the display device 10 may be located inside the first interlayer insulating layer 205 and the second interlayer insulating layer 207, or may be located below the first interlayer insulating layer 205. In this case, as a thickness to which a tensile force is applied is reduced, or as a portion to which a tensile force is applied is not present in at least one of the first interlayer insulating layer 205 and the second interlayer insulating layer 207, the damage to the display device 10 due to an object falling on the upper surface of the display device 10 may be reduced or prevented.

Figure 5:
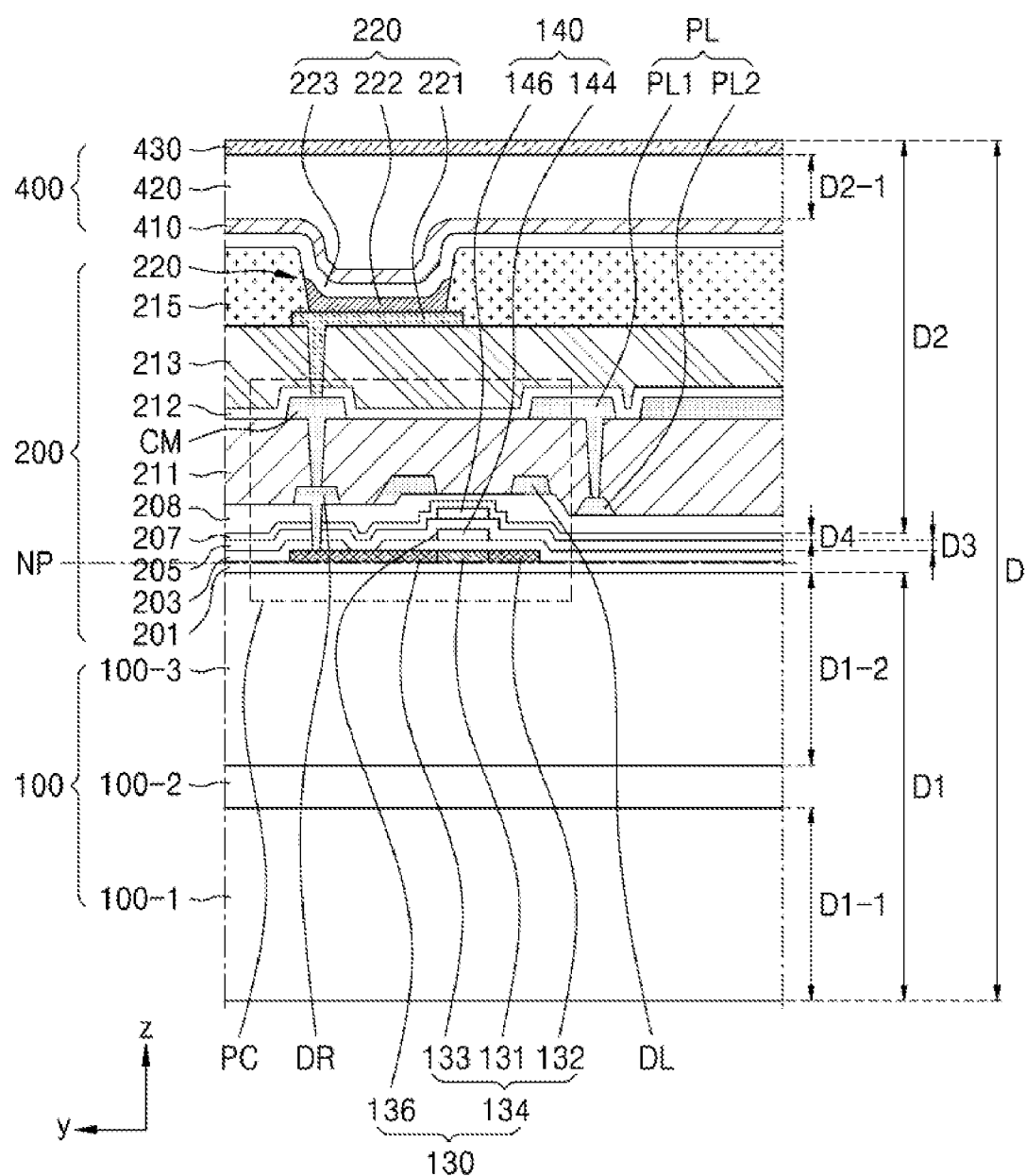
FIG. 5 is a cross-sectional view of part of a display device according to some embodiments.

FIG. 5 is a cross-sectional view of a part of the display device 10, according to some embodiments.

Referring to FIG. 5, the display layer 200 is arranged on the substrate 100, and a detailed structure of the display layer 200 is the same as that described above with reference to FIG. 4. The thin film encapsulation layer 400 may be arranged on the display layer 200.

In the above case, the contact metal layer CM may be covered by a fourth interlayer insulating layer 212. In this state, the fourth interlayer insulating layer 212 may include a material that is the same as, or similar to, the third interlayer insulating layer 209 of FIG. 4. In other embodiments, the fourth interlayer insulating layer 212 is not arranged on the contact metal layer CM, and the second organic insulating layer 213 may be arranged thereon.

In the above case, the neutral plane NP may be located inside at least one of the first interlayer insulating layer 205 and the second interlayer insulating layer 207, or below the second interlayer insulating layer 207.

Furthermore, the first thickness D1 may be greater than the second thickness D2, and the first thickness D1 may be between about 0.5 times and about 0.76 times the thickness D from the bottom of the substrate 100 to the upper surface of the thin film encapsulation layer 400. Furthermore, the first thickness D1 may be greater than the second thickness D2. The first-1 thickness D1-1 of the first substrate 100-1 and the first-2 thickness D1-2 of the second substrate 100-3 may be the same as each other, or different from each other. For example, one of the first-1 thickness D1-1 and the first-2 thickness D1-2 may be greater than the other of the first-1 thickness D1-1 and the first-2 thickness D1-2.

The second-1 thickness D2-1 of the organic encapsulation layer 420 may be between about 0.16 times and about 0.26 times the thickness D from the bottom of the substrate 100 to the upper surface of the thin film encapsulation layer 400.

The shock absorbing layer 208 may be arranged on the second interlayer insulating layer 207. In this state, as the shock absorbing layer 208 is the same as, or similar to, that described with reference to FIG. 4, a detailed description thereof is omitted.

Furthermore, the third thickness D3 of the first interlayer insulating layer 205 may be greater than the fourth thickness D4 of the second interlayer insulating layer 207. The first interlayer insulating layer 205 may include at least one of silicon oxide and silicon oxynitride, and the second interlayer insulating layer 207 may include silicon nitride.

Accordingly, even when an object falls on the upper surface of the display device 10, and an impact is delivered to the thin film encapsulation layer 400, the display device 10 may reduce the thickness D4 of the second interlayer insulating layer 207 where a tensile force is generated, with respect to the neutral plane NP.

Furthermore, when the neutral plane NP is located below the second interlayer insulating layer 207, and an impact is delivered to the thin film encapsulation layer 400, as the display device 10 includes the first interlayer insulating layer 205 that endures the tensile force well, and the first interlayer insulating layer 205 might not be damaged.

As the display device 10 includes the shock absorbing layer 208, the force delivered in the thickness direction of the display device 10 may be prevented from being delivered to the first interlayer insulating layer 205 and the second interlayer insulating layer 207.

Figure 6:
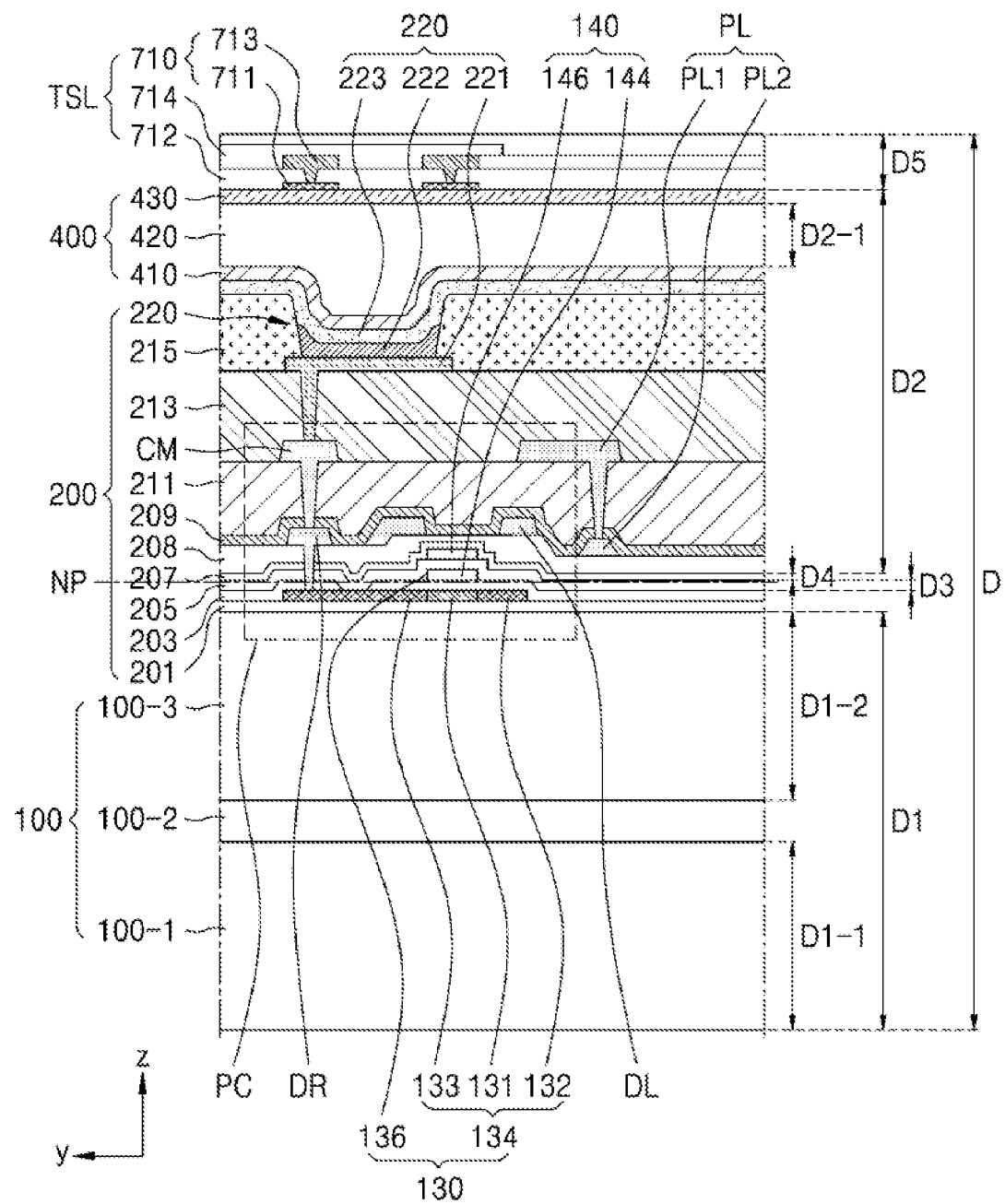
FIG. 6 is a cross-sectional view of part of a display device according to some embodiments.

FIG. 6 is a cross-sectional view of a part of the display device 10, according to some embodiments.

Referring to FIG. 6, the display layer 200 is arranged on the substrate 100, and a detailed structure of the display layer 200 is the same as that described above with reference to FIG. 4.

The display device 10 may include the input detection member TSL arranged on the thin film encapsulation layer 400. A fifth thickness D5 of the input detection member TSL may be about 0.1 times the thickness D or less, the thickness D being from the lower surface of the substrate 100 to the upper surface of the thin film encapsulation layer 400. When the fifth thickness D5 exceeds about 0.1 times the thickness D from the lower surface of the substrate 100 to the upper surface of the thin film encapsulation layer 400, the neutral plane NP may be located above the second interlayer insulating layer 207. Thus, when an object collides with an upper surface of the input detection member TSL, at least one of the first interlayer insulating layer 205 and the second interlayer insulating layer 207 may be damaged.

The input detection member TSL may have a structure in which a first touch conductive layer 711, a first insulating layer 712, a second touch conductive layer 713, and a second insulating layer 714 are sequentially stacked. The touch electrode TD may include the first touch conductive layer 711 and the second touch conductive layer 713.

In some embodiments, the second touch conductive layer 713 may function as a sensor unit for detecting whether there is a contact, and the first touch conductive layer 711 may function as a connection unit for connecting the second touch conductive layer 713 that is patterned.

In some embodiments, both of the first touch conductive layer 711 and the second touch conductive layer 713 may function as sensor units. For example, the first insulating layer 712 may define a via hole for exposing an upper surface of the first touch conductive layer 711, and the first touch conductive layer 711 may be connected to the second touch conductive layer 713 through the via hole. As such, by using the first touch conductive layer 711 and the second touch conductive layer 713, resistance of the touch electrode TD may be reduced, and thus a response speed of the input detection member TSL may be improved.

In some embodiments, the touch electrode TD may have a mesh structure so that light emitted from the organic light-emitting diode 220 passes therethrough. Accordingly, the first touch conductive layer 711 and the second touch conductive layer 713 of the touch electrode TD may be arranged not to overlap the light-emitting area of the organic light-emitting diode 220.

Each of the first touch conductive layer 711 and the second touch conductive layer 713 may be a single film or multilayer film including a conductive material exhibiting excellent conductivity. For example, each of the first touch conductive layer 711 and the second touch conductive layer 713 may be a single film or multilayer film including a transparent conductive layer and a conductive material such as Al, Cu, and/or Ti, and the like. The transparent conductive layer may include a transparent conductive oxide such as ITO, IZO, ZnO, indium tin zinc oxide (ITZO), and the like. The transparent conductive layer may further include a conductive polymer such as PEDOT, metal nano wire, graphene, and the like. In some embodiments, each of the first touch conductive layer 711 and the second touch conductive layer 713 may have a stacked structure of Ti/Al/Ti.

Each of the first insulating layer 712 and the second insulating layer 714 may include an inorganic material or an organic material. The inorganic material may be at least any one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride. The organic material may be at least any one of acrylic resin, meta acrylic resin, polyisoprene, vinyl-based resin, epoxy-based resin, urethane-based resin, cellulose-based resin, and perylene-based resin.

As the input detection member TSL is directly formed on the thin film encapsulation layer 400 by deposition and the like, a separate adhesive layer may not be needed on the thin film encapsulation layer 400. Accordingly, the thickness of the display device 10 may be reduced.

In the above case, the neutral plane NP may be located inside at least one of the first interlayer insulating layer 205 and the second interlayer insulating layer 207, or below the second interlayer insulating layer 207.

Furthermore, the first thickness D1 may be greater than the second thickness D2, and the first thickness D1 may be between about 0.5 times and about 0.76 times the thickness D from the bottom of the substrate 100 to the upper surface of the thin film encapsulation layer 400. The first-1 thickness D1-1 of the first substrate 100-1 and the first-2 thickness D1-2 of the second substrate 100-3 may be the same or different from each other. For example, one of the first-1 thickness D1-1 and the first-2 thickness D1-2 may be greater than the other of the first-1 thickness D1-1 and the first-2 thickness D1-2.

The second-1 thickness D2-1 of the organic encapsulation layer 420 may be between about 0.16 times and about 0.26 times the thickness D from the bottom of the substrate 100 to the upper surface of the thin film encapsulation layer 400.

The shock absorbing layer 208 may be arranged on the second interlayer insulating layer 207. In this state, as the shock absorbing layer 208 is the same as, or similar to, that described with reference to FIG. 4, a detailed description thereof is omitted.

Furthermore, the third thickness D3 of the first interlayer insulating layer 205 may be greater than the fourth thickness D4 of the second interlayer insulating layer 207. The first interlayer insulating layer 205 may include at least one of silicon oxide and silicon oxynitride, and the second interlayer insulating layer 207 may include silicon nitride.

Accordingly, even when an object falls on the upper surface of the display device 10 and an impact is delivered to the thin film encapsulation layer 400, the display device 10 may reduce the thickness D4 of the second interlayer insulating layer 207 where a tensile force is generated due to the impact, with respect to the neutral plane NP.

Furthermore, when the neutral plane NP is located below the second interlayer insulating layer 207, and an impact is delivered to the thin film encapsulation layer 400, as the display device 10 includes the first interlayer insulating layer 205 that endures the tensile force relatively well, the first interlayer insulating layer 205 might not be damaged.

As the display device 10 includes the shock absorbing layer 208, delivery of the force, which is delivered in the thickness direction of the display device 10, to the first interlayer insulating layer 205 and the second interlayer insulating layer 207 may be reduced or prevented.

Figure 7:
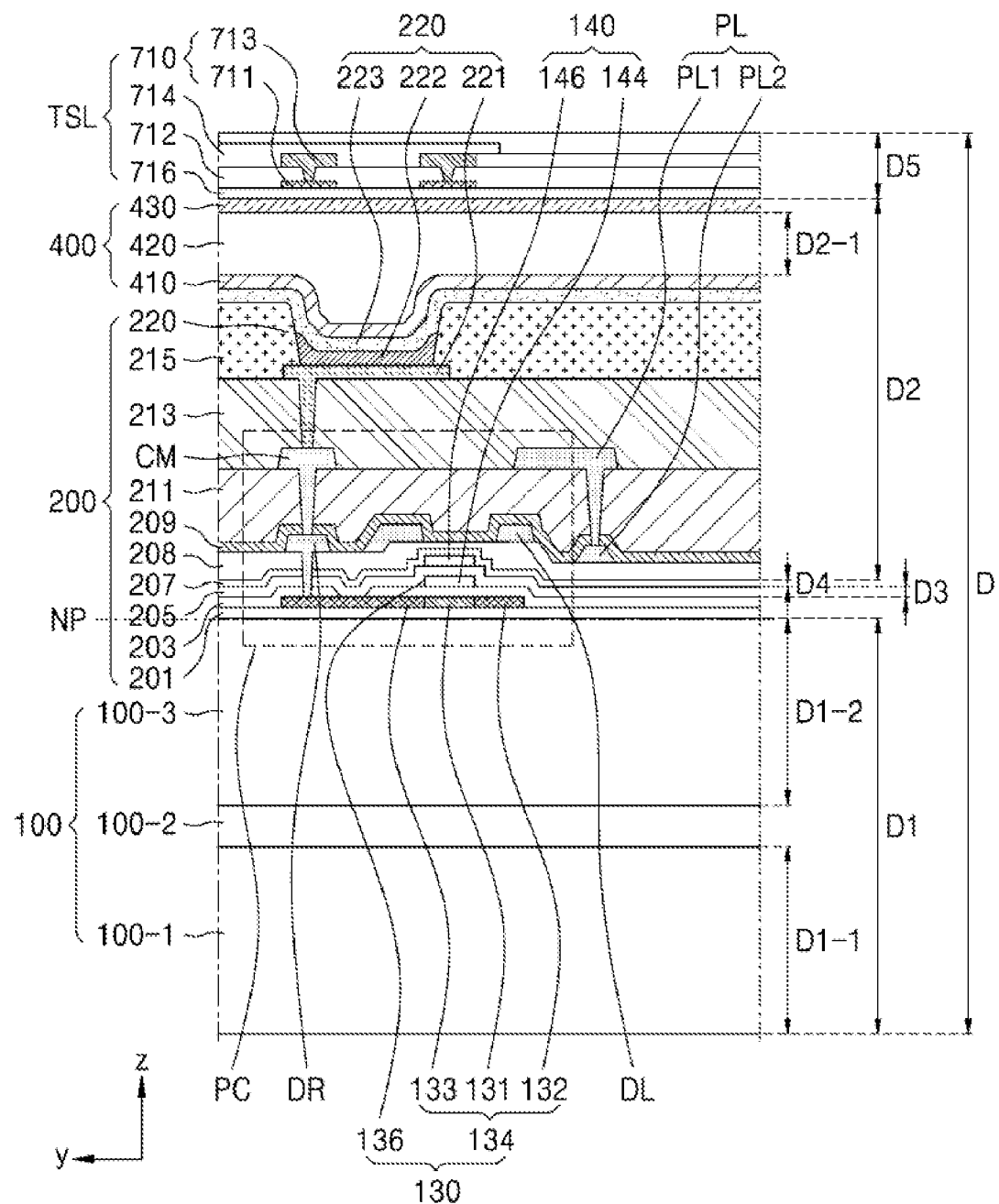
FIG. 7 is a cross-sectional view of part of a display device according to some embodiments.

FIG. 7 is a cross-sectional view of a part of the display device 10, according to some embodiments.

Referring to FIG. 7, the display layer 200 is arranged on the substrate 100, and a detailed structure of the display layer 200 is the same as that described above with reference to FIG. 5.

The display device 10 may include the input detection member TSL arranged on the thin film encapsulation layer 400. The fifth thickness D5 of the input detection member TSL may be about 0.1 times or less the thickness D from the lower surface of the substrate 100 to the upper surface of the thin film encapsulation layer 400.

Contrastingly, when the fifth thickness D5 exceeds about 0.1 times the thickness D from the lower surface of the substrate 100 to the upper surface of the thin film encapsulation layer 400, the neutral plane NP may be located above the second interlayer insulating layer 207. Thus, when an object collides with the upper surface of the input detection member TSL, at least one of the first interlayer insulating layer 205 and the second interlayer insulating layer 207 may be damaged.

The input detection member TSL may have a structure in which a first touch conductive layer 711, a first insulating layer 712, a second touch conductive layer 713, and a second insulating layer 714 are sequentially stacked. The touch electrode TD may include the first touch conductive layer 711 and the second touch conductive layer 713. In this state, the first touch conductive layer 711, the first insulating layer 712, the second touch conductive layer 713, and the second insulating layer 714 are the same as those described with reference to FIG. 6.

The input detection member TSL may further include a touch buffer layer 716 between the thin film encapsulation layer 400 and the first insulating layer 712.

The touch buffer layer 716 may reduce or prevent damage of the thin film encapsulation layer 400, and may block an interference signal that may be generated during driving of the input detection member TSL. The touch buffer layer 716 may include an inorganic material such as silicon oxide, silicon nitride, silicon oxynitride, aluminum oxide, aluminum nitride, titanium oxide, titanium nitride, or the like, or an organic material such as polyimide, polyester, acryl, or the like, and may be formed as a plurality of stacked structures including the above materials.

In the above case, the neutral plane NP may be located inside at least one of the first interlayer insulating layer 205 and the second interlayer insulating layer 207, or below the second interlayer insulating layer 207.

Furthermore, the first thickness D1 may be greater than the second thickness D2, the first thickness D1 may be between about 0.5 times and about 0.76 times the thickness D from the bottom of the substrate 100 to the upper surface of the thin film encapsulation layer 400. The first-1 thickness D1-1 of the first substrate 100-1 and the first-2 thickness D1-2 of the second substrate 100-3 may be the same, or may be different from each other. For example, one of the first-1 thickness D1-1 and the first-2 thickness D1-2 may be greater than the other of the first-1 thickness D1-1 and the first-2 thickness D1-2.

The second-1 thickness D2-1 of the organic encapsulation layer 420 may be between about 0.16 times and about 0.26 times the thickness D from the bottom of the substrate 100 to the upper surface of the thin film encapsulation layer 400.

The shock absorbing layer 208 may be arranged on the second interlayer insulating layer 207. In this state, as the shock absorbing layer 208 is the same as, or similar to, that described with reference to FIG. 4, a detailed description thereof is omitted.

Furthermore, the third thickness D3 of the first interlayer insulating layer 205 may be greater than the fourth thickness D4 of the second interlayer insulating layer 207. The first interlayer insulating layer 205 may include at least one of silicon oxide and silicon oxynitride, and the second interlayer insulating layer 207 may include silicon nitride.

Accordingly, even when an object falls on the upper surface of the display device 10 and an impact is delivered to the thin film encapsulation layer 400, the display device 10 may reduce the thickness D4 of the second interlayer insulating layer 207 where a tensile force is generated, with respect to the neutral plane NP.

Furthermore, when the neutral plane NP is located below the second interlayer insulating layer 207, and an impact is delivered to the thin film encapsulation layer 400, as the display device 10 includes the first interlayer insulating layer 205 that endures the tensile force relatively well, the first interlayer insulating layer 205 may not be damaged.

As the display device 10 includes the shock absorbing layer 208, the force delivered in the thickness direction of the display device 10 may be substantially prevented from being delivered to the first interlayer insulating layer 205 and the second interlayer insulating layer 207.

Figure 8:
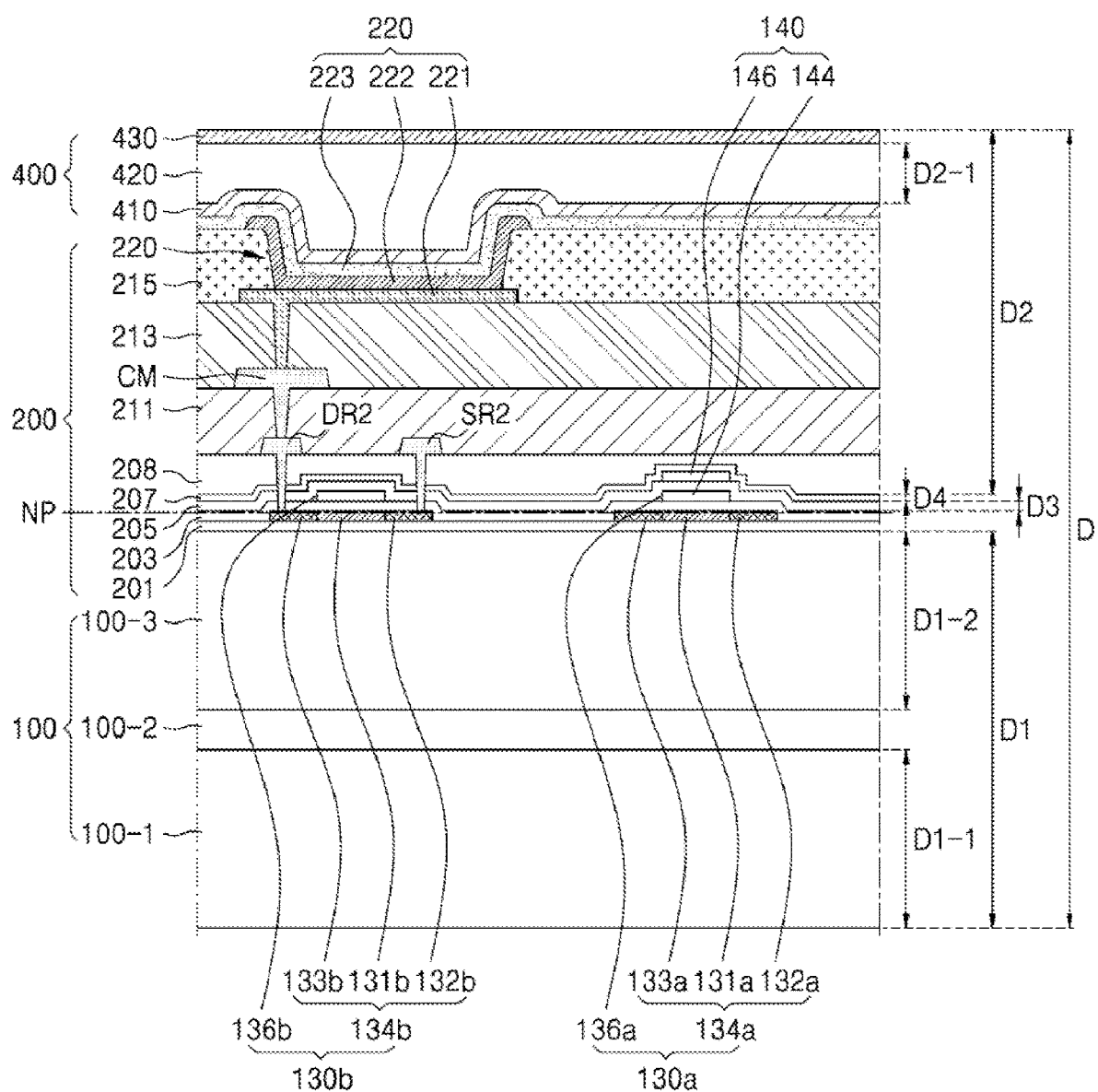
FIG. 8 is a cross-sectional view of part of a display device according to some embodiments.

FIG. 8 is a cross-sectional view of a part of the display device 10, according to some embodiments.

Referring to FIG. 8, the display device 10 may include the substrate 100, the buffer layer 201, the gate insulating layer 203, a first transistor 130a, a second transistor 130b, the storage capacitor 140, the first interlayer insulating layer 205, the second interlayer insulating layer 207, the shock absorbing layer 208, the third interlayer insulating layer 209, the first organic insulating layer 211, the organic light-emitting diode 220, the pixel defining layer 215, and the thin film encapsulation layer 400. In this state, as the buffer layer 201, the storage capacitor 140, the first interlayer insulating layer 205, the second interlayer insulating layer 207, the shock absorbing layer 208, the third interlayer insulating layer 209, the first organic insulating layer 211, the organic light-emitting diode 220, the pixel defining layer 215, and the thin film encapsulation layer 400 are the same as, or similar to, those described with reference to FIG. 4, detailed descriptions thereof are omitted.

The first transistor 130a may include a first semiconductor layer 134a and a first gate electrode 136a. In this state, the first semiconductor layer 134a may include a first source region 132a, a first drain region 133a, and a first channel region 131a. In some embodiments the first source region 132a and the first drain region 133a each may be connected to metals, and the metals may be a first source electrode and a first drain electrode of the first transistor 130a. The first gate electrode 136a may include a low-resistance metal material. The storage capacitor 140 may include the first electrode 144 and the second electrode 146 overlapping each other. In this case, the first transistor 130a, the first gate electrode 136a, and the storage capacitor 140 may be, respectively, the same as, or similar to, the transistor 130, the gate electrode 136 and the storage capacitor 140, which are described in FIG. 4.

The second transistor 130b may include a second semiconductor layer 134b and a second gate electrode 136b. In this state, the second semiconductor layer 134b may include a second source region 132b, a second drain region 133b, and a second channel region 131b. In this case, the second source region 132b, the second drain region 133b, and the second channel region 131b may respectively correspond to above-described first source region 132a, first drain region 133a, and first channel region 131a.

A contact metal layer CM may connect the pixel electrode 221 to the second drain region 133b. In this state, separate metals may be connected to the second source region 132b and the second drain region 133b, and the metals may be a second source electrode SR2 and a second drain electrode DR2. In this state, one of the second source electrode SR2 and the second drain electrode DR2 may be connected to the contact metal layer CM. In the following description, for convenience of explanation, a case in which the contact metal layer CM is connected to the second drain region 133b through the second drain electrode DR2 is mainly described.

The second gate electrode 136b may be arranged on the second semiconductor layer 134b. In this state, the gate insulating layer 203 may be arranged between the second gate electrode 136b and the second semiconductor layer 134b. In this case, the second gate electrode 136b may be the same as, or similar to, the first gate electrode 136a.

In the above case, as illustrated in FIG. 4 the relationship between the first thickness D1, the second thickness D2, the third thickness D3, the fourth thickness D4, and the thickness D may be adopted in the same or similar manner. Furthermore, the above-described relationship may be identically applied to the relationship between the first-1 thickness D1-1 and the first-2 thickness D1-2 and the relationship between the second-1 thickness D2-1 and the thickness D.

In the above case, the location of the neutral plane NP may be located between the first interlayer insulating layer 205 and the second interlayer insulating layer 207 or below the first interlayer insulating layer 205.

Accordingly, as the display device 10 effectively absorbs the impact during falling of an object, even when an object falls onto the display device 10, the display device 10 may not be broken or damaged. Furthermore, as the display device 10 has no area where a tensile force is generated when colliding with an object, and/or as the first interlayer insulating layer 205 and the second interlayer insulating layer 207 are less present in the area where a tensile force is generated, damage of at least one of the first interlayer insulating layer 205 and the second interlayer insulating layer 207 may be reduced or prevented.

Figure 9:
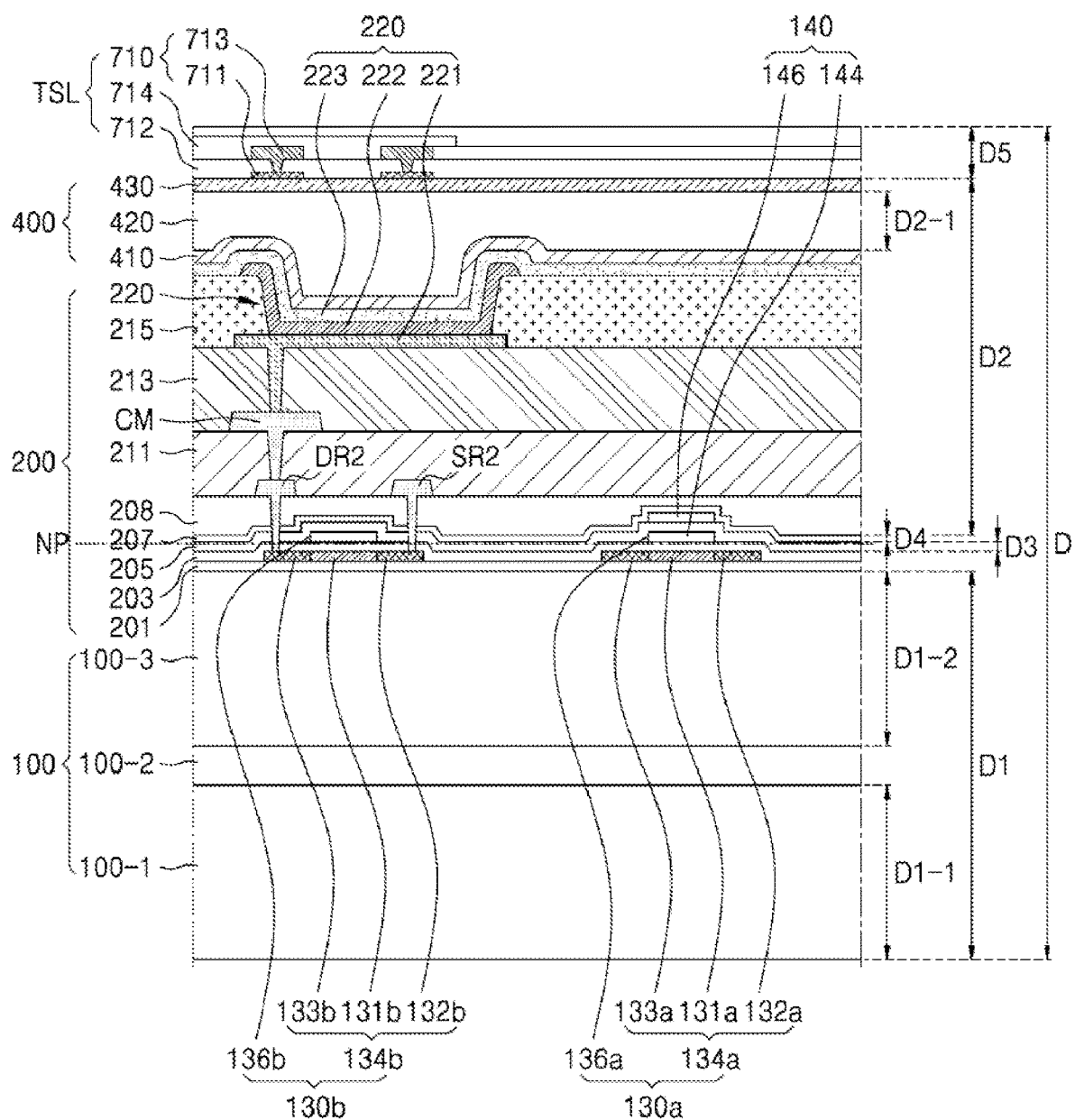
FIG. 9 is a cross-sectional view of part of a display device according to some embodiments.

FIG. 9 is a cross-sectional view of a part of the display device 10, according to some embodiments.

Referring to FIG. 9, the display device 10 may include the substrate 100, the buffer layer 201, the gate insulating layer 203, the first transistor 130a, the second transistor 130b, the storage capacitor 140, the first interlayer insulating layer 205, the second interlayer insulating layer 207, the shock absorbing layer 208, the third interlayer insulating layer 209, the first organic insulating layer 211, the organic light-emitting diode 220, the pixel defining layer 215, the thin film encapsulation layer 400, and the input detection member TSL. In this state, the substrate 100, the buffer layer 201, the first transistor 130a, the second transistor 130b, the storage capacitor 140, the first interlayer insulating layer 205, the second interlayer insulating layer 207, the shock absorbing layer 208, the third interlayer insulating layer 209, the first organic insulating layer 211, the organic light-emitting diode 220, the pixel defining layer 215, and the thin film encapsulation layer 400 may be the same as, or similar to, those described with reference to FIG. 8.

The input detection member TSL may be arranged on the upper surface of the thin film encapsulation layer 400. In this state, the input detection member TSL may have a structure in which the first touch conductive layer 711, the first insulating layer 712, the second touch conductive layer 713, and the second insulating layer 714 are sequentially stacked. In this case, as the input detection member TSL is the same as, or similar to, that described with reference to FIG. 6, a detailed description thereof is omitted.

In the above case, the relationship between the first thickness D1, the second thickness D2, the third thickness D3, the fourth thickness D4, and the thickness D may be adopted in the same or similar manner. Furthermore, the relationships described with reference to FIGS. 4 and 6 may be identically applied as the relationship between the first-1 thickness D1-1 and the first-2 thickness D1-2, the relationship between the second-1 thickness D2-1 and the thickness D, and the relationship between the fifth thickness D5 and the thickness D.

Accordingly, even when an object falls on the upper surface of the display device 10 and an impact is delivered to the thin film encapsulation layer 400, the display device 10 may reduce the thickness D4 of the second interlayer insulating layer 207 where a tensile force is generated, with respect to the neutral plane NP.

Furthermore, when the neutral plane NP is located below the second interlayer insulating layer 207, and an impact is delivered to the thin film encapsulation layer 400, as the display device 10 includes the first interlayer insulating layer 205 that endures the tensile force well, the first interlayer insulating layer 205 may not be damaged.

As the display device 10 includes the shock absorbing layer 208, the force delivered in the thickness direction of the display device 10 may be prevented from being delivered to the first interlayer insulating layer 205 and the second interlayer insulating layer 207.

Figure 10:
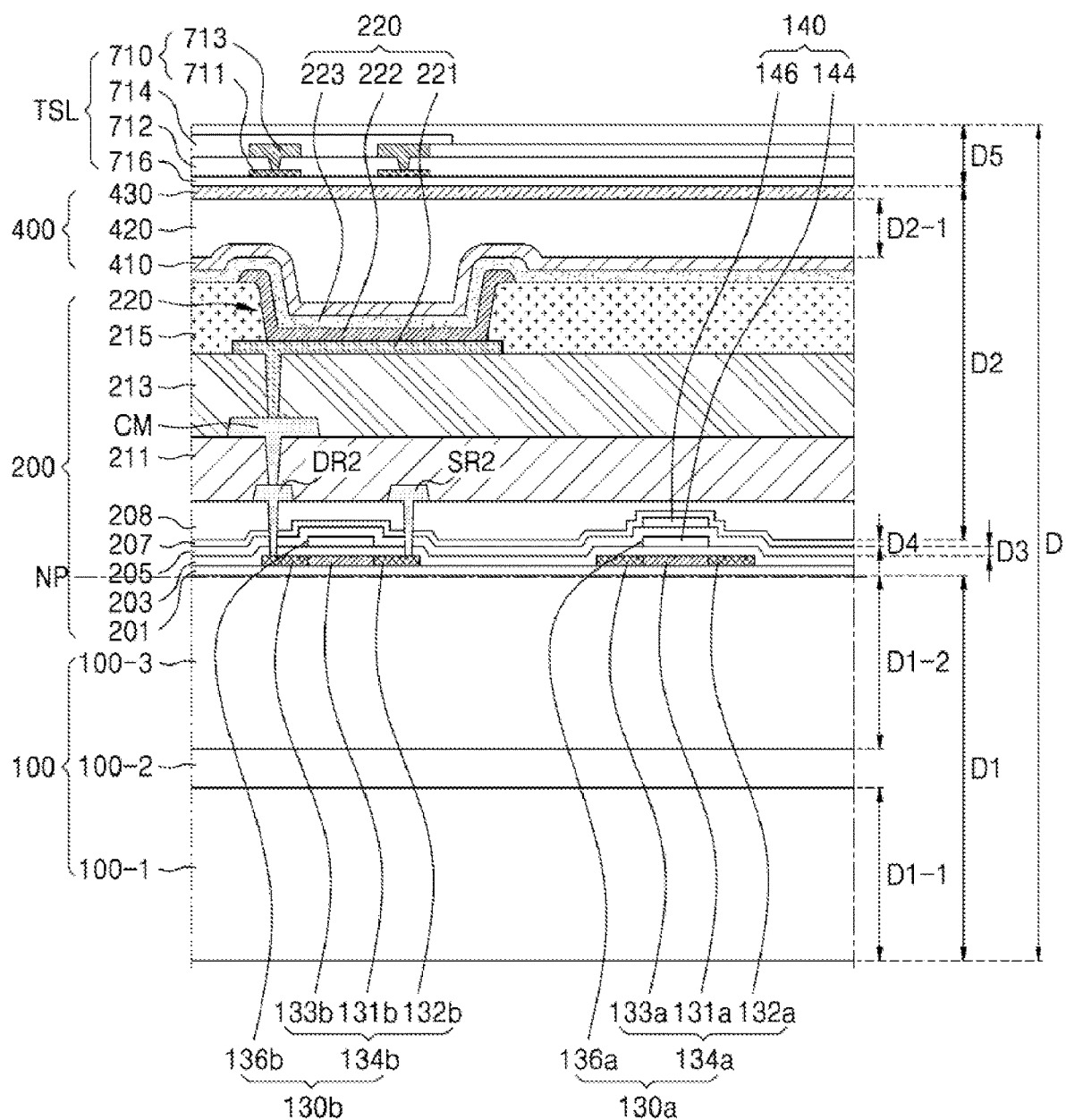
FIG. 10 is a cross-sectional view of part of a display device according to some embodiments.

FIG. 10 is a cross-sectional view of a part of the display device 10, according to some embodiments.

Referring to FIG. 10, the display device 10 may include the substrate 100, the buffer layer 201, the gate insulating layer 203, the first transistor 130a, the second transistor 130b, the storage capacitor 140, the first interlayer insulating layer 205, the second interlayer insulating layer 207, the shock absorbing layer 208, the third interlayer insulating layer 209, the first organic insulating layer 211, the organic light-emitting diode 220, the pixel defining layer 215, the thin film encapsulation layer 400, and the input detection member TSL. In this state, the substrate 100, the buffer layer 201, the first transistor 130a, the second transistor 130b, the storage capacitor 140, the first interlayer insulating layer 205, the second interlayer insulating layer 207, the shock absorbing layer 208, the third interlayer insulating layer 209, the first organic insulating layer 211, the organic light-emitting diode 220, the pixel defining layer 215, and the thin film encapsulation layer 400 may be the same as, or similar to, those described with reference to FIG. 8.

The input detection member TSL may be arranged on the upper surface of the thin film encapsulation layer 400. In this state, the input detection member TSL may have a structure in which the first touch conductive layer 711, the first insulating layer 712, the second touch conductive layer 713, and the second insulating layer 714, and a touch buffer layer 716 are sequentially stacked. In this case, as the input detection member TSL is the same as, or similar to, that described with reference to FIG. 7, a detailed description thereof is omitted.

In the above case, the relationship between the first thickness D1, the second thickness D2, the third thickness D3, the fourth thickness D4, and the thickness D may be adopted in the same or similar manner. Furthermore, the relationships described with reference to FIGS. 4 and 7 may be identically applied as the relationship between the first-1 thickness D1-1 and the first-2 thickness D1-2, the relationship between the second-1 thickness D2-1 and the thickness D, and the relationship between the fifth thickness D5 and the thickness D.

Accordingly, even when an object falls on the upper surface of the display device 10 and an impact is delivered to the thin film encapsulation layer 400, the display device 10 may reduce the thickness D4 of the second interlayer insulating layer 207 where a tensile force is generated with respect to the neutral plane NP.

Furthermore, when the neutral plane NP is located below the second interlayer insulating layer 207, and an impact is delivered to the thin film encapsulation layer 400, as the display device 10 includes the first interlayer insulating layer 205 that endures the tensile force relatively well, the first interlayer insulating layer 205 may not be damaged.

As the display device 10 includes the shock absorbing layer 208, delivery of the force, which is delivered in the thickness direction of the display device 10, to the first interlayer insulating layer 205 and the second interlayer insulating layer 207 may be reduced or prevented.

Figure 11:
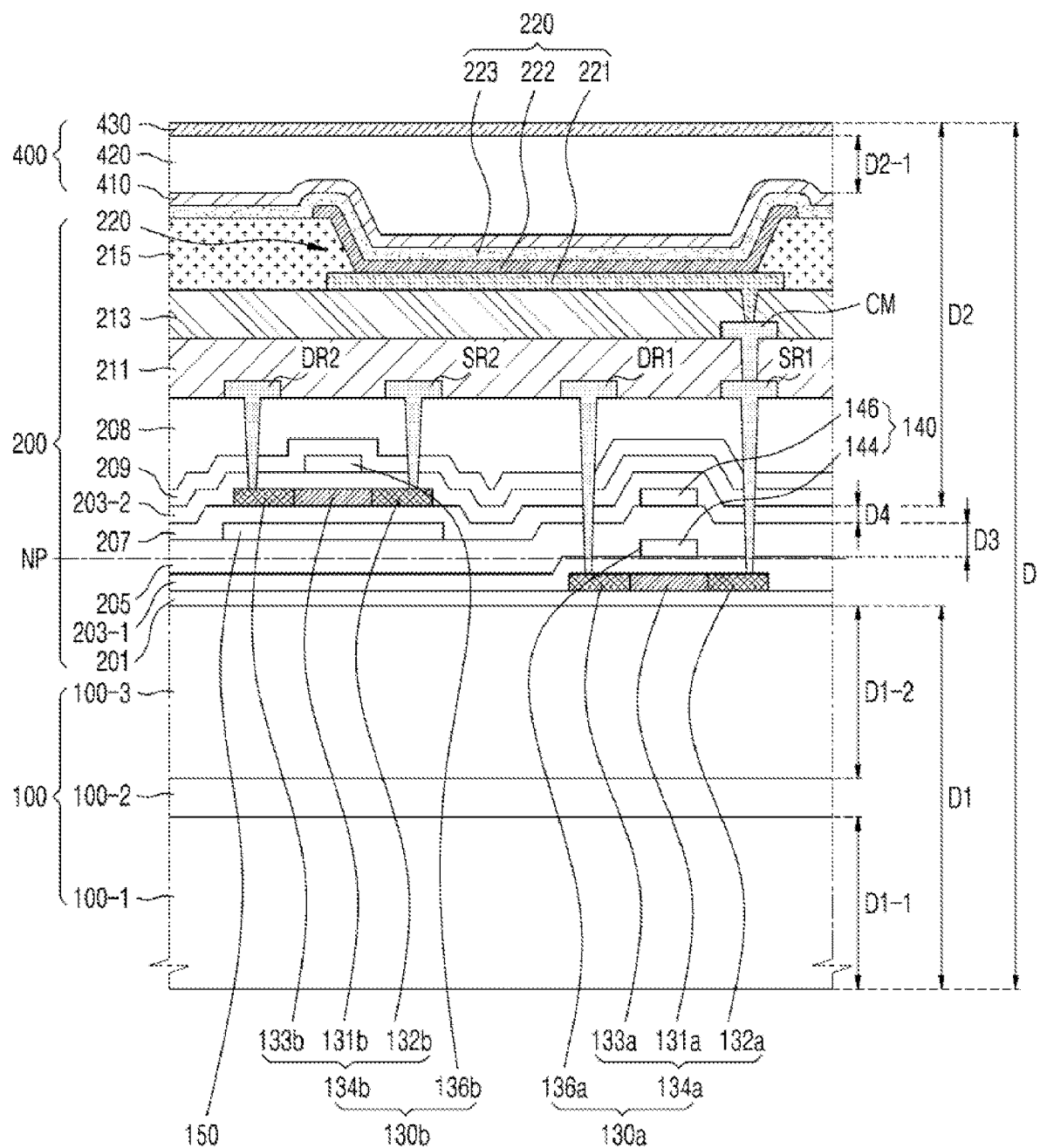
FIG. 11 is a cross-sectional view of part of a display device according to some embodiments.

FIG. 11 is a cross-sectional view of a part of the display device 10, according to some embodiments.

Referring to FIG. 11, the display device 10 may include the substrate 100, the buffer layer 201, a first gate insulating layer 203-1, the first transistor 130a, the second transistor 130b, the storage capacitor 140, the first interlayer insulating layer 205, a shielding layer 150, the second interlayer insulating layer 207, a second gate insulating layer 203-2, the shock absorbing layer 208, the third interlayer insulating layer 209, the first organic insulating layer 211, the organic light-emitting diode 220, the pixel defining layer 215, the thin film encapsulation layer 400, and the input detection member TSL. In this state, the substrate 100 and the buffer layer 201 may be the same as, or similar to, those described with reference to FIG. 8.

The first transistor 130a may include the first semiconductor layer 134a and the first gate electrode 136a. In this state, the first semiconductor layer 134a may be arranged on the buffer layer 201, and covered by the first gate insulating layer 203-1. In this case, the first semiconductor layer 134a may include the first source region 132a, the first channel region 131a, and the first drain region 133a. In this state, one of the first source region 132a and the first drain region 133a may be connected to the pixel electrode 221 through the contact metal layer CM. For example, when the first source region 132a is connected to the pixel electrode 221, the first source region 132a may be connected to the contact metal layer CM through a first source electrode SR1 connected to the first source region 132a, and the contact metal layer CM may be connected to the pixel electrode 221. In other embodiments, the first drain region 133a may be connected to the pixel electrode 221 through a first drain electrode DR1 and the contact metal layer CM. In the following description, for convenience of explanation, a case in which the first source region 132a is connected to the pixel electrode 221 is mainly described.

The first gate insulating layer 203-1 may include an inorganic material including oxide or nitride. For example, the first gate insulating layer 203-1 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), and the like.

The first gate electrode 136a may be arranged on the first gate insulating layer 203-1. In this state, the first gate electrode 136a may function as the first electrode 144 of the storage capacitor 140.

The first interlayer insulating layer 205 may be arranged on the first gate electrode 136a. In this state, the first interlayer insulating layer 205 may be the same as, or similar to, that described with reference to FIG. 8.

The shielding layer 150 as above may be arranged on the first interlayer insulating layer 205. In this state, the shielding layer 150 is arranged below the second transistor 130b to apply an appropriate voltage, and thus the second transistor 130b may not be affected by external light and the electric potential of the substrate 100. In some embodiments, the shielding layer 150 may be arranged below the first transistor 130a. The shielding layer 150 may include metal, and may include a single layer or a multilayer. For example, the shielding layer 150 may have a single layer structure including Mo. In other embodiments, the shielding layer 150 may have, above the buffer layer 201, a three-layer structure sequentially including a first layer having Ti, a second layer having Al, and a third layer having Ti.

The second electrode 146 of the storage capacitor 140 may be arranged on the first interlayer insulating layer 205 as above.

The second interlayer insulating layer 207 may be arranged on the shielding layer 150 and the second electrode 146. In this state, the second interlayer insulating layer 207 may be the same as, or similar to, that described with reference to FIG. 8.

The second semiconductor layer 134b of the second transistor 130b may be arranged on the second interlayer insulating layer 207. In this state, the second semiconductor layer 134b may include the second source region 132b, the second channel region 131b, and the second drain region 133b. The second source region 132b and the second drain region 133b may be connected to a metal layer, and the metal layer may function as the second source electrode SR2 and the second drain electrode DR2.

The second gate insulating layer 203-2 may be arranged on the second semiconductor layer 134b as above. In this state, the second gate insulating layer 203-2 may be the same as, or similar to, the first gate insulating layer 203-1.

The second gate electrode 136b may be arranged on the second gate insulating layer 203-2. In this state, as the second gate electrode 136b is the same as, or similar to, that described with reference to FIG. 8, a detailed description thereof is omitted.

The second gate electrode 136b may be covered by the third interlayer insulating layer 209. In this state, the third interlayer insulating layer 209 may be the same as, or similar to, at least one of the first interlayer insulating layer 205 and the second interlayer insulating layer 207 that are described above.

The shock absorbing layer 208 may be arranged on the third interlayer insulating layer 209. In this state, the shock absorbing layer 208 may include an organic material, and may be the same as, or similar to, that described with reference to FIG. 8.

The contact metal layer CM may be arranged on the shock absorbing layer 208 as above. Furthermore, the first organic insulating layer 211 and the second organic insulating layer 213 may be sequentially arranged on the contact metal layer CM. In this state, as the first organic insulating layer 211 and the second organic insulating layer 213 are the same as, or similar to, those described with reference to FIG. 4, detailed descriptions thereof are omitted.

The organic light-emitting diode 220 may include the pixel electrode 221, the intermediate layer 222, and the counter electrode 223. The pixel electrode 221 may be connected to the first source region 132a or the first drain region 133a of the first transistor 130a, or to the second source region 132b or the second drain region 133b of the second transistor 130b, through the contact metal layer CM. In this state, as the organic light-emitting diode 220 is the same as, or similar to, that described with reference to FIG. 4, a detailed description thereof is omitted. In the following description, for convenience of explanation, a case in which the first source region 132a is connected to the pixel electrode 221 is mainly described.

The thin film encapsulation layer 400 may be arranged on the organic light-emitting diode 220. The thin film encapsulation layer 400 may include the first inorganic encapsulation layer 410, the organic encapsulation layer 420, and the second inorganic encapsulation layer 430, which are sequentially stacked. In this state, as the thin film encapsulation layer 400 is the same as, or similar to, that described with reference to FIG. 4, a detailed description thereof is omitted.

In the above case, the relationship between the first thickness D1, the second thickness D2, the third thickness D3, the fourth thickness D4, and the thickness D may be adopted in the same or similar manner. Furthermore, the relationships described with reference to FIGS. 4 and 7 may be identically applied as the relationship between the first-1 thickness D1-1 and the first-2 thickness D1-2 and the relationship between the second-1 thickness D2-1 and the thickness D.

In some embodiments, the display device 10 may further include an input detection member. In this case, the input detection member may be arranged on the thin film encapsulation layer 400, as illustrated in FIGS. 9 and 10. In some embodiments, the relationship between the fifth thickness D5 and the thickness D may have the same as that described with reference to FIGS. 9 and 10.

Accordingly, even when an object falls on the upper surface of the display device 10 and an impact is delivered to the thin film encapsulation layer 400, the display device 10 may reduce the thickness D4 of the second interlayer insulating layer 207 where a tensile force is generated, with respect to the neutral plane NP.

Furthermore, when the neutral plane NP is located below the second interlayer insulating layer 207, and an impact is delivered to the thin film encapsulation layer 400, as the display device 10 includes the first interlayer insulating layer 205 that endures the tensile force well, the first interlayer insulating layer 205 may not be damaged.

As the display device 10 includes the shock absorbing layer 208, the force delivered in the thickness direction of the display device 10 may be prevented from being delivered to the first interlayer insulating layer 205 and the second interlayer insulating layer 207.

In a display device according to some embodiments, dark spots may prevented despite an impact that is externally applied.

A display device according to some embodiments may be freely modified, and some layers in the display device may be prevented from being broken or damaged during modification.

According to a display device according to some embodiments, an external impact may be effectively processed.

It should be understood that embodiments described herein should be considered in a descriptive sense only and not for purposes of limitation. Descriptions of features or aspects within the embodiments should typically be considered as available for other similar features or aspects in other embodiments. While some embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display device comprising:
a substrate;
a semiconductor layer on the substrate;
a first interlayer insulating layer on the semiconductor layer;
a second interlayer insulating layer on the first interlayer insulating layer;
a source electrode or a drain electrode on the second interlayer insulating layer, and connected to the semiconductor layer;
an organic light-emitting diode connected to the source electrode or the drain electrode; and
a thin film encapsulation layer on the organic light-emitting diode,
wherein, a neutral plane is inside or below the first interlayer insulating layer or the second interlayer insulating layer, such that a compressive force on one side of the neutral plane corresponding to an impact applied to the thin film encapsulation layer causes a tensile force on another side of the neutral plane.

2. The display device of claim 1, wherein a distance from a bottom of the substrate to a bottom of the first interlayer insulating layer is greater than a distance from an upper surface of the second interlayer insulating layer to an upper surface of the thin film encapsulation layer.

3. The display device of claim 1, wherein the thin film encapsulation layer comprises an organic encapsulation layer, and
wherein a thickness of the organic encapsulation layer is between about 0.16 times and about 0.26 times a distance from a bottom of the substrate to an upper surface of the thin film encapsulation layer.

4. The display device of claim 1, wherein a thickness of the first interlayer insulating layer is greater than a thickness of the second interlayer insulating layer.

5. The display device of claim 1, wherein the second interlayer insulating layer has a structure in which an inorganic material and an organic material are sequentially stacked.

6. The display device of claim 1, wherein the first interlayer insulating layer comprises silicon oxide.

7. The display device of claim 1, further comprising a shock absorbing layer on the second interlayer insulating layer.

8. The display device of claim 7, wherein the shock absorbing layer comprises an organic material.

9. The display device of claim 1, further comprising an input detection member on the thin film encapsulation layer.

10. A display device comprising:
a substrate;
a semiconductor layer on the substrate;
an interlayer insulating layer on the semiconductor layer;
a source electrode or a drain electrode on the interlayer insulating layer, and connected to the semiconductor layer;
an organic light-emitting diode connected to the source electrode or the drain electrode; and
a thin film encapsulation layer on the organic light-emitting diode,
wherein a thickness of the substrate is between about 0.5 times and about 0.76 times a distance from a lower surface of the substrate to an upper surface of the thin film encapsulation layer.

11. The display device of claim 10, wherein the thin film encapsulation layer comprises an organic encapsulation layer, and
wherein a thickness of the organic encapsulation layer is between about 0.16 times and about 0.26 times a distance from a bottom of the substrate to the upper surface of the thin film encapsulation layer.

12. The display device of claim 10, wherein the interlayer insulating layer comprises:
a first interlayer insulating layer; and
a second interlayer insulating layer on the first interlayer insulating layer.

13. The display device of claim 12, wherein a thickness of the first interlayer insulating layer is greater than a thickness of the second interlayer insulating layer.

14. The display device of claim 12, wherein the second interlayer insulating layer has a structure in which an inorganic material and an organic material are sequentially stacked.

15. The display device of claim 12, wherein the first interlayer insulating layer comprises silicon oxide.

16. The display device of claim 10, further comprising a shock absorbing layer on the interlayer insulating layer.

17. The display device of claim 16, wherein the shock absorbing layer comprises an organic material.

18. The display device of claim 10, further comprising an input detection member on the thin film encapsulation layer.

19. A display device comprising:
a substrate;
a semiconductor layer on the substrate;
a first interlayer insulating layer on the semiconductor layer;
a second interlayer insulating layer on the first interlayer insulating layer;
a source electrode or a drain electrode on the second interlayer insulating layer, and connected to the semiconductor layer;
an organic light-emitting diode connected to the source electrode or the drain electrode; and
a thin film encapsulation layer on the organic light-emitting diode,
wherein a compressive force generated in the first interlayer insulating layer or the second interlayer insulating layer corresponding to an impact applied to the thin film encapsulation layer causes a tensile force away from the thin film encapsulation layer.

20. The display device of claim 19, wherein the second interlayer insulating layer has a structure in which an inorganic material and an organic material are sequentially stacked.

* * * * *